US011776088B2

(12) United States Patent
Kang et al.

(10) Patent No.: US 11,776,088 B2
(45) Date of Patent: Oct. 3, 2023

(54) ELECTRONIC DEVICE GENERATING IMAGE DATA AND CONVERTING THE GENERATED IMAGE DATA AND OPERATING METHOD OF THE ELECTRONIC DEVICE

(71) Applicant: SAMSUNG ELECTRONICS CO., LTD., Suwon-si (KR)

(72) Inventors: Hee Kang, Hwaseong-si (KR); Chanyoung Jang, Pohang-si (KR); Seongwook Song, Seoul (KR); Wooseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 332 days.

(21) Appl. No.: 17/138,108

(22) Filed: Dec. 30, 2020

(65) Prior Publication Data
US 2021/0287333 A1 Sep. 16, 2021

(30) Foreign Application Priority Data

Mar. 11, 2020 (KR) .................. 10-2020-0030365
Jul. 13, 2020 (KR) .................. 10-2020-0086235

(51) Int. Cl.
*G06T 3/40* (2006.01)
*G06T 7/80* (2017.01)
*H03M 1/12* (2006.01)
*G06T 5/50* (2006.01)
*H04N 23/12* (2023.01)

(52) U.S. Cl.
CPC .......... *G06T 3/4007* (2013.01); *G06T 3/4038* (2013.01); *G06T 5/50* (2013.01); *G06T 7/80* (2017.01); *H03M 1/12* (2013.01); *H04N 23/12* (2023.01); *G06T 2207/20016* (2013.01); *G06T 2207/20224* (2013.01)

(58) Field of Classification Search
CPC ....... G06T 3/4007; G06T 3/4038; G06T 5/50; G06T 7/80; G06T 2207/20016; G06T 2207/20224; G06T 3/4053; H03M 1/12; H03M 1/123; H03M 1/56; H04N 9/07; H04N 9/04515; H04N 9/04557
USPC .............................. 382/100, 300; 348/222.1
See application file for complete search history.

(56) References Cited

U.S. PATENT DOCUMENTS 6,882,364 B1    4/2005   Inuiya et al.
8,229,212 B2    7/2012   Siddiqui et al.
8,938,121 B2    1/2015   Lee et al.
(Continued)

FOREIGN PATENT DOCUMENTS

JP      11168752 A   *  6/1999
JP      2004173103      6/2004
(Continued)

*Primary Examiner* — Tom Y Lu
*Assistant Examiner* — Pardis Sohraby
(74) *Attorney, Agent, or Firm* — F. CHAU & ASSOCIATES, LLC

(57) ABSTRACT

An electronic device includes an image sensor configured to capture a target to generate first image data, and a processor configured to perform directional interpolation on a first area of the first image data to generate first partial image data, perform upscale on a second area of the first image data to generate second partial image data, and combine the first partial image data and the second partial image data to generate second image data.

18 Claims, 13 Drawing Sheets

(56) References Cited

U.S. PATENT DOCUMENTS

| | | | |
|---|---|---|---|
| 9,179,113 B2 | 11/2015 | Tachi | |
| 9,324,161 B2 | 4/2016 | Zund et al. | |
| 11,107,178 B2* | 8/2021 | Vlachos | G06T 11/40 |
| 11,445,109 B2* | 9/2022 | Furukawa | H04N 23/951 |
| 2005/0231607 A1* | 10/2005 | Kwon | H04N 23/843 |
| | | | 348/222.1 |
| 2013/0265329 A1* | 10/2013 | Tsujimoto | G06T 3/4038 |
| | | | 345/629 |
| 2014/0010478 A1* | 1/2014 | Ndiour | H04N 7/0142 |
| | | | 382/300 |
| 2016/0093023 A1* | 3/2016 | Prasad | G06V 20/62 |
| | | | 382/173 |
| 2016/0267628 A1* | 9/2016 | Yang | G06T 11/60 |
| 2017/0178292 A1* | 6/2017 | Jiang | H04N 23/63 |
| 2017/0213319 A1* | 7/2017 | Kurihara | G06T 3/4053 |
| 2018/0152633 A1* | 5/2018 | Wei | H04N 23/88 |
| 2018/0295307 A1* | 10/2018 | Saito | H04N 25/75 |
| 2019/0174058 A1 | 6/2019 | Richardson et al. | |
| 2020/0043135 A1* | 2/2020 | Chou | G06T 5/50 |
| 2020/0294191 A1* | 9/2020 | Chuang | H04N 25/134 |
| 2020/0358966 A1* | 11/2020 | Lee | H04N 13/271 |
| 2021/0044783 A1* | 2/2021 | Kwag | H04N 23/843 |

FOREIGN PATENT DOCUMENTS

| | | |
|---|---|---|
| KR | 10-0866187 | 10/2008 |
| KR | 10-1724308 | 4/2017 |
| KR | 10-1907451 | 10/2018 |

\* cited by examiner

FIG. 4

ELECTRONIC DEVICE GENERATING IMAGE DATA AND CONVERTING THE GENERATED IMAGE DATA AND OPERATING METHOD OF THE ELECTRONIC DEVICE

CROSS-REFERENCE TO RELATED APPLICATIONS

This application claims priority under 35 U.S.C. § 119 to Korean Patent Application Nos. 10-2020-0030365 filed on Mar. 11, 2020 and 10-2020-0086235 filed on Jul. 13, 2020, in the Korean Intellectual Property Office, the disclosures of which are incorporated by reference herein in their entireties.

TECHNICAL FIELD

Exemplary embodiments of the inventive concept described herein relate to an electronic device, and more particularly, relate to an electronic device generating image data and converting the generated image data.

DISCUSSION OF RELATED ART

An image sensor may generate image data indicating a target or scenery from the target or the scenery. As performance of mobile devices such as smart phones and smart pads improve, image sensors may be employed in the mobile devices. Image sensors employed in the mobile devices may generate image data and may be used to create image-based content.

One of the main functions for electronic devices generating image data by using image sensors is to generate image data having improved resolution or image quality. Additionally, one of the main functions for mobile electronic devices is to have low power consumption.

SUMMARY

According to an exemplary embodiment of the inventive concept, an electronic device includes an image sensor configured to capture a target to generate first image data, and a processor. The processor is configured to perform directional interpolation on a first area of the first image data to generate first partial image data, perform upscale on a second area of the first image data to generate second partial image data, and combine the first partial image data and the second partial image data to generate second image data.

According to an exemplary embodiment of the inventive concept, an operating method of an electronic device which includes an image sensor and a processor includes capturing, at the image sensor, a target to generate first image data, performing, at the processor, directional interpolation on a first area of the first image data to generate first partial image data, performing, at the processor, upscale on a second area of the first image data to generate second partial image data, and combining, at the processor, the first partial image data and the second partial image data to generate second image data.

According to an exemplary embodiment of the inventive concept, an electronic device includes an image sensor, and a processor configured to receive first image data from the image sensor and convert and output the first image data as second image data. The image sensor includes a lens, a color filter array that includes color filters configured to pass specific frequency components of a light incident through the lens, a pixel array that includes pixels configured to convert intensities of the specific frequency components of the light passing through the color filters into analog signals, and an analog-to-digital converter configured to convert the analog signals into digital signals and output the digital signals to the image sensor. The processor includes a first memory configured to receive the first image data, location information storage configured to store location information, a first conversion circuit configured to perform a first conversion on first input data and to output a result of the first conversion as first partial image data, a second conversion circuit configured to perform a second conversion on second input data and to output a result of the second conversion as second partial image data, a selection circuit configured to output the first image data in the form of the first input data, the second input data, or the first input data and the second input data, based on the location information, and a mixer configured to combine the first partial image data and the second partial image data to generate the second image data, in response to a selection signal from the selection circuit. When the first partial image data and the second partial image data are output together, the mixer is configured to perform alpha blending on the first partial image data and the second partial image data.

According to an exemplary embodiment of the inventive concept, an operating method of an electronic device including an image sensor and a processor includes generating, at the image sensor, first image data, receiving, at the processor, partial data of the first image data, determining, at the processor, a location of the received partial data based on location information, where the location indicates whether the received partial data belongs to a first area, a second area, or a third area, applying, at the processor, only a first conversion to the received partial data to generate converted partial data, when the received partial data belongs to the first area, applying, at the processor, only a second conversion to the received partial data to generate the converted partial data, when the received partial data belongs to the second area, applying, at the processor, the first conversion and the second conversion to the received partial data to generate the converted partial data, when the received partial data belongs to the third area, and applying alpha blending on the converted partial data, when the received partial data belongs to the third area. The first conversion and the second conversion are different.

BRIEF DESCRIPTION OF THE DRAWINGS

The above and other objects and features of the inventive concept will become apparent by describing in detail exemplary embodiments thereof with reference to the accompanying drawings.

FIG. 4 illustrates an example in which color filters of the color filter array of FIG. 1 are arranged depending on a second-type array pattern according to an exemplary embodiment of the inventive concept.

DETAILED DESCRIPTION OF THE EMBODIMENTS

Figure 1:
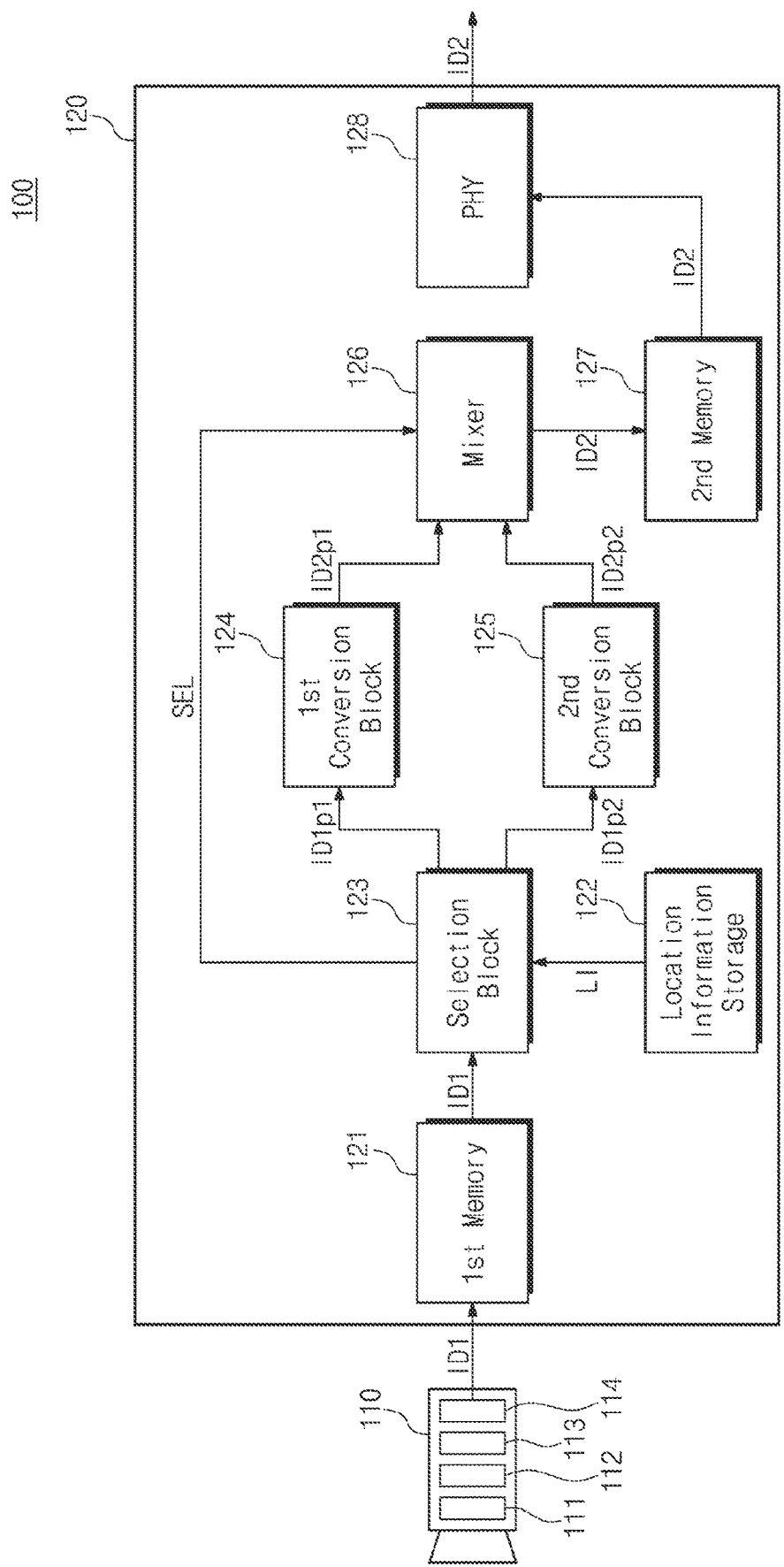
FIG. 1 illustrates an electronic device according to an exemplary embodiment of the inventive concept.

Exemplary embodiments of the inventive concept provide an electronic device generating image data having an improved resolution or image quality and reducing power consumption, and an operating method of the electronic device.

Below, exemplary embodiments of the inventive concept will be described in detail with reference to the accompanying drawings. Like reference numerals may refer to like elements throughout this application.

FIG. 1 illustrates an electronic device according to an exemplary embodiment of the inventive concept. Referring to FIG. 1, an electronic device 100 may include an image sensor 110 and a processor 120. The image sensor 110 may be based on a CMOS image sensor (CIS) or a charge-coupled device (CCD).

The image sensor 110 may include a lens 111, a color filter array 112, a pixel array 113, and an analog-to-digital converter 114. The lens 111 may transfer a light incident from the outside or a target to the color filter array 112.

The color filter array 112 may include color filters that are applied to lights incident through the lens 111. The color filter array 112 may include color filters arranged in rows and columns. The color filters may include red filters "R", green filters "G", and blue filters "B" arranged according to a specific pattern.

The red filters "R" may pass a component (e.g., a frequency component) corresponding to a red color from among components of an incident light. The green filters "G" may pass a component corresponding to a green color from among the components of the incident light. The blue filters "B" may pass a component corresponding to a blue color from among the components of the incident light.

The pixel array 113 may include pixels arranged in rows and columns. The pixels of the pixel array 113 may correspond to the color filters of the color filter array 112, respectively.

For example, each of pixels corresponding to the green filters "G" may output information corresponding to the amount (or intensity) of green light in the form of a current or voltage. Each of pixels corresponding to the red filters "R" may output information corresponding to the amount (or intensity) of red light in the form of a current or voltage. Each of pixels corresponding to the blue filters "B" may output information corresponding to the amount (or intensity) of blue light in the form of a current or voltage. Currents or voltages that the pixels of the pixel array 113 output may be analog signals in which information of light amounts (or intensities) are expressed by current amounts or voltage levels.

The analog-to-digital converter 114 may convert the analog signals output from the pixels of the pixel array 113 into digital signals. The digital signals converted by the analog-to-digital converter 114 may be output as first image data ID1. The first image data ID1 may correspond to one frame. The image sensor 110 may output the first image data ID1 by obtaining image data in units of one or more rows and repeating the output of the obtained image data.

The processor 120 may include a first memory 121, location information storage 122, a selection block 123, a first conversion block 124, a second conversion block 125, a mixer 126, and a second memory 127. As will be described further below, the selection block 123, the first conversion block 124, the second conversion block 125, and the mixer 126 may be circuits.

The first memory 121 may be configured to store the first image data ID1 received from the image sensor 110. The first memory 121 may store the first image data ID1 corresponding to one frame by accumulating image data sequentially received from the image sensor 110. The first memory 121 may include a random access memory (RAM). For example, the first memory 121 may include one of various random access memories such as a dynamic RAM, a static RAM, a phase-change RAM, a ferroelectric RAM, a magnetic RAM, or a resistive RAM.

The location information storage 122 may store location information LI. The location information LI may be based on a characteristic of the image sensor 110 (or the lens 111). For example, the location information LI may include information about two or more areas, which have different resolutions (or image qualities), of the first image data ID1 obtained by the image sensor 110.

For example, due to characteristics of the image sensor 110 and due to characteristics and variables of components constituting the image sensor 110, a resolution level of the first image data ID1 obtained by the image sensor 110 may vary depending on a location on the first image data ID1. The location information LI may include information of a resolution of the first image data ID1, which is determined based on the location on the first image data ID1.

For example, the location information LI may include information of a first area of the first image data ID1, in which a resolution (or image quality) level is higher than a first threshold level, information of a second area of the first image data ID1, in which a resolution (or image quality) level is lower than or equal to a second threshold level, and information of a third area of the first image data ID1, in which a resolution (or image quality) level is lower than or equal to the first threshold level and higher than the second threshold level. In an exemplary embodiment of the inventive concept, the location information LI may be obtained in calibration of the image sensor 110, and may be stored in the location information storage 122.

The location information storage 122 may include nonvolatile memory cells such as flash memory cells, phase-change memory cells, ferroelectric memory cells, resistive memory cells, or magnetic memory cells. The location information storage 122 may include an electrical fuse, an anti-fuse, or a laser fuse.

The selection block 123 may receive the location information LI from the location information storage 122. The selection block 123 may receive the first image data ID1 from the first memory 121. The selection block 123 may divide the first image data ID1 into first partial image data ID1p1 and second partial image data ID1p2 based on the location information LI.

The selection block 123 may output partial data of the first image data ID1, which belong to the first area, as a portion of the first partial image data ID1p1, based on the location information LI. The selection block 123 may output partial data of the first image data ID1, which belong to the second area, as a portion of the second partial image data ID1p2, based on the location information LI. The selection block 123 may output partial data of the first image data ID1, which belong to the third area, as a portion of the first partial image data ID1p1 and a portion of the second partial image data ID1p2, based on the location information LI.

For example, the selection block 123 may receive partial data of the first image data ID1 in a specific unit. The specific unit may be in the form of one or more rows of the first image data ID1 or in the form of a window. Depending on a location on the first image data ID1, at which the received partial data of the first image data ID1 is placed, the selection block 123 may activate at least one of the first conversion block 124 and the second conversion block 125 based on the location information LI.

The selection block 123 may output the received partial data of the first image data ID1 to a conversion block(s) activated from among the first conversion block 124 and the second conversion block 125.

For example, when the received partial data of the first image data ID1 is determined based on the location information LI as being present in the first area, the selection block 123 may activate the first conversion block 124 and may output the received partial data of the first image data ID1 to the first conversion block 124 as a portion of the first partial image data ID1p1. The selection block 123 may generate and transmit a selection signal SEL to indicate that the first conversion block 124 is selected.

When the received partial data of the first image data ID1 is determined based on the location information LI as being present in the second area, the selection block 123 may activate the second conversion block 125 and may output the received partial data of the first image data ID1 to the second conversion block 125 as a portion of the second partial image data ID1p2. The selection block 123 may generate and transmit the selection signal SEL to indicate that the second conversion block 125 is selected.

When the received partial data of the first image data ID1 is determined based on the location information LI as being present in the third area, the selection block 123 may activate the first conversion block 124 and the second conversion block 125, and may output the received partial data of the first image data ID1 to the first conversion block 124 and the second conversion block 125 as a portion of the first partial image data ID1p1 and a portion of the second partial image data ID1p2, respectively. The selection block 123 may generate and transmit the selection signal SEL to indicate that the first conversion block 124 and the second conversion block 125 are selected.

The first conversion block 124 may perform a first conversion on the first partial image data ID1p1. The first conversion block 124 may output a result of the conversion as a third partial image data ID2p1. The second conversion block 125 may perform a second conversion on the second partial image data ID1p2. The second conversion block 125 may output a result of the conversion as a fourth partial image data ID2p2.

For example, the first conversion may include remosaic, interpolation, or directional interpolation. Compared to the second conversion, the first conversion may use relatively complicated circuits and may consume a relatively great amount of power. Compared to the second conversion, the first conversion may maintain a quality of image data, in particular, a high resolution.

For example, the second conversion may include binning or upscale. The binning may calculate an average or an intermediate value of pieces of color information. Afterwards, a resolution may be improved based on the upscale. Compared to the first conversion, the second conversion may use relatively simple circuits and may consume relatively small amount of power.

The mixer 126 may generate second image data ID2 by combining the third partial image data ID2p1 received from the first conversion block 124 and the fourth partial image data ID2p2 received from the second conversion block 125.

For example, when partial data of the first image data ID1 are converted by the first conversion block 124, the mixer 126 may receive the converted data as a portion of the third partial image data ID2p1 and may store the converted data in the second memory 127. When partial data of the first image data ID1 are converted by the second conversion block 125, the mixer 126 may receive the converted data as a portion of the fourth partial image data ID2p2 and may store the converted data in the second memory 127.

When partial data of the first image data ID1 are converted by the first conversion block 124 and the second conversion block 125, the mixer 126 may receive the converted data as a portion of the third partial image data ID2p1 and a portion of the fourth partial image data ID2p2, and may store the converted data in the second memory 127. The mixer 126 may perform alpha blending on the received pieces of data. The mixer 126 may store a result of the alpha blending in the second memory 127.

In an exemplary embodiment of the inventive concept, the mixer 126 may store a conversion result of partial data of the first image data ID1 at given locations of the second memory 127, such that the second image data ID2 are stored in the second memory 127 when the conversion of the first image data ID1 is completed.

The second memory 127 may include a random access memory (RAM). For example, the second memory 127 may include one of various random access memories such as a dynamic RAM, a static RAM, a phase-change RAM, a ferroelectric RAM, a magnetic RAM, or a resistive RAM.

A physical block (PHY) 128 may output the second image data ID2 stored in the second memory 127 to an external device. For example, the physical block 128 may output the second image data ID2 in units of lines. The physical block 128 may output the second image data ID2 based on the C-PHY defined by the MIPI (Mobile Industry Processor Interface) specification.

In an exemplary embodiment of the inventive concept, the processor 120 may be an application processor, a general-purpose processor, or a special-purpose image signal processor designed to process image data. Each of the components of the processor 120 may be implemented with a hardware circuit or may be implemented in the form of instructions executable by a circuit configured to execute a command.

Figure 2:
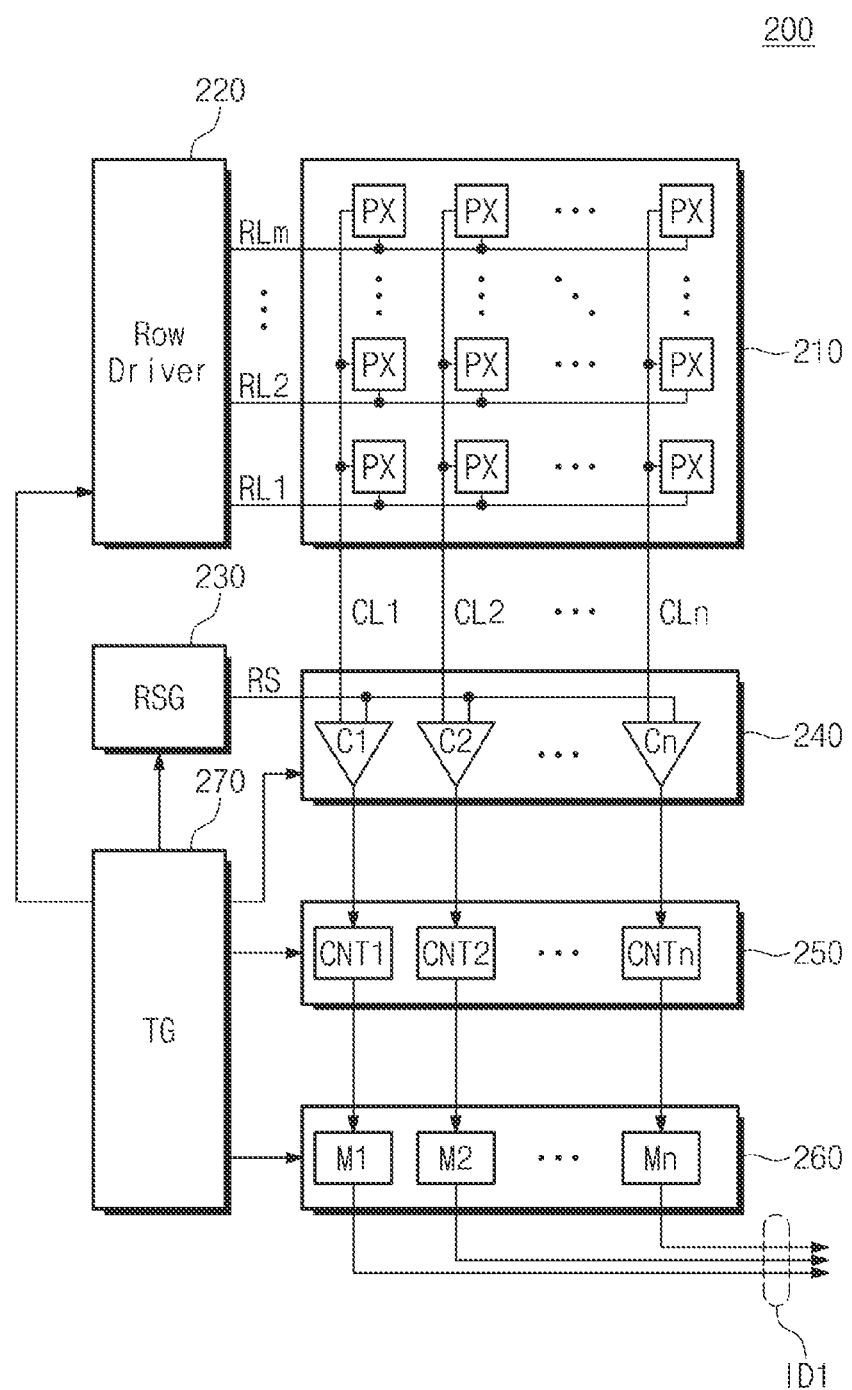
FIG. 2 illustrates an image sensor according to an exemplary embodiment of the inventive concept.

FIG. 2 illustrates an image sensor according to an exemplary embodiment of the inventive concept. An image sensor 200 of FIG. 2 may correspond to the image sensor 110 of FIG. 1. Referring to FIGS. 1 and 2, the image sensor 200 may include a pixel array 210, a row driver 220, a ramp signal generator (RSG) 230, a comparator group 240, a counter group 250, a memory group 260, and a timing generator (TG) 270.

The pixel array 210 may include a plurality of pixels PX arranged along rows and columns in the form of a matrix. Each of the plurality of pixels PX may include a photoelectric conversion element. For example, the photoelectric conversion element may include a photo diode, a photo transistor, a photo gate, or a pinned photo diode. Each of the plurality of pixels PX may sense a light by using the photoelectric conversion element thereof, and may convert the amount of the sensed light into an electrical signal, for example, a voltage or a current.

The plurality of pixels PX of the pixel array 210 may be divided into a plurality of pixel groups. Each pixel group may include at least two or more pixels. In an exemplary embodiment of the inventive concept, a pixel group may include pixels arranged in two rows and two columns or in three rows and three columns. Pixels constituting a pixel group may share at least one floating diffusion region.

The color filter array 112 including color filters respectively corresponding to the pixels PX of the pixel array 210 may be provided on/above the pixel array 210. The lens 111 may be provided on/above the color filter array 112. The color filters of the color filter array 112 may include the red filters "R", the green filters "G", and the blue filters "B". A pixel group may correspond to color filters of the same color.

For example, a pixel group may include a red pixel to convert a light of a red spectrum into an electrical signal, a green pixel to convert a light of a green spectrum into an electrical signal, or a blue pixel to convert a light of a blue spectrum into an electrical signal, together with a filter of the color filter array 112. For example, the filters of the color filter array 112 on the pixel array 210 may be arranged in the form of a Bayer pattern or in the form of a non-Bayer pattern.

The row driver 220 may be connected with rows of the pixels PX of the pixel array 210 through first to m-th row lines RL1 to RLm (where m is a positive integer). The row driver 220 may decode an address and/or a control signal generated by the timing generator 270. Depending on a result of the decoding, the row driver 220 may sequentially select the first to m-th row lines RL1 to RLm of the pixel array 210, and may drive a selected row line with a specific voltage. For example, the row driver 220 may drive a selected row line with a voltage appropriate for sensing a light.

Each of the first to m-th row lines RL1 to RLm connected with the rows of the pixels PX may include two or more lines. The two or more lines may include, for example, a signal for selecting a pixel, a signal for resetting a floating diffusion region, a signal for selecting a column line, etc.

The ramp signal generator 230 may generate a ramp signal RS. The ramp signal generator 230 may operate under control of the timing generator 270. For example, the ramp signal generator 230 may operate in response to a control signal such as a ramp enable signal or a mode signal. When the ramp enable signal is activated, the ramp signal generator 230 may generate the ramp signal RS having a slope set based on the mode signal. For example, the ramp signal generator 230 may generate the ramp signal RS that consistently decreases or increases from an initial level over time.

The comparator group 240 may be connected with columns of the pixels PX of the pixel array 210 through first to n-th column lines CL1 to CLn (where n is a positive integer). The comparator group 240 may include first to n-th comparators C1 to Cn respectively connected with the first to n-th column lines CL1 to CLn. The first to n-th comparators C1 to Cn may receive the ramp signal RS from the ramp signal generator 230 in common.

The first to n-th comparators C1 to Cn may compare voltages (or currents) of the first to n-th column lines CL1 to CLn with the ramp signal RS. When the ramp signal RS that consistently decreases (or increases) becomes smaller (or greater) than voltages (or currents) of the first to n-th comparators C1 to Cn, each of the first to n-th comparators C1 to Cn may invert an output signal. In other words, the first to n-th comparators C1 to Cn may output results of comparing magnitudes (or amounts) of voltages (or currents), output from the pixels PX to the first to n-th column lines CL1 to CLn, with the ramp signal RS.

The counter group 250 may include first to n-th counters CNT1 to CNTn respectively receiving output signals of the first to n-th comparators C1 to Cn. The first to n-th counters CNT1 to CNTn may start a count operation at substantially the same time, for example, when, before, or after the ramp signal RS starts to decrease (or increase). The first to n-th counters CNT1 to CNTn may stop the count operation when output signals of the first to n-th comparators C1 to Cn are inverted. For example, each of the first to n-th counters CNT1 to CNTn may stop the count operation when an output signal of a corresponding comparator among the first to n-th comparators C1 to Cn is inverted.

In other words, the first to n-th comparators C1 to Cn may measure magnitudes of voltages (or currents) of the first to n-th column lines CL1 to CLn by using the ramp signal RS, and the first to n-th counters CNT1 to CNTn may convert the measured results into digital values.

First to n-th memories M1 to Mn of the memory group 260 may include first to n-th memories M1 to Mn respectively receiving output signals of the first to n-th counters CNT1 to CNTn. The first to n-th memories M1 to Mn may store the received output signals, and may output the stored signals as the first image data ID1. For example, the first to n-th memories M1 to Mn may include latches.

The timing generator 270 may control timings at which the image sensor 200 operates. The timing generator 270 may control timings at which the row driver 220 sequentially selects the first to m-th row lines RL1 to RLm, and may control timings at which signals are transferred through two or more lines included in a row line selected from the first to m-th row lines RL1 to RLm.

The timing generator 270 may control timings at which the ramp signal generator 230 generates the ramp signal RS and initializes the ramp signal RS. The timing generator 270 may control timings at which the first to n-th comparators C1 to Cn start a comparison operation and the first to n-th comparators C1 to Cn are initialized.

The timing generator 270 may control timings at which the first to n-th counters CNT1 to CNTn start a count operation and the first to n-th counters CNT1 to CNTn are initialized. The timing generator 270 may control timings at which the first to n-th memories M1 to Mn output the first image data ID1 and the first to n-th memories M1 to Mn are initialized.

According to an exemplary embodiment of the inventive concept, the timing generator 270 may be configured to control various timings of various components for the image sensor 200 to capture an image of a target and to output the first image data ID1.

The row driver 220, the ramp signal generator 230, the comparator group 240, the counter group 250, the memory group 260, and the timing generator 270 may correspond to the analog-to-digital converter 114 converting analog signals generated by the pixels PX into digital signals.

In an exemplary embodiment of the inventive concept, the image sensor 200 may generate and output image data in units of one row or two or more rows of the pixels PX. The image sensor 200 may output the first image data ID1 corresponding to one frame by generating and outputting the image data while sequentially selecting the rows RL1 to RLm of the pixels PX.

Figure 3:
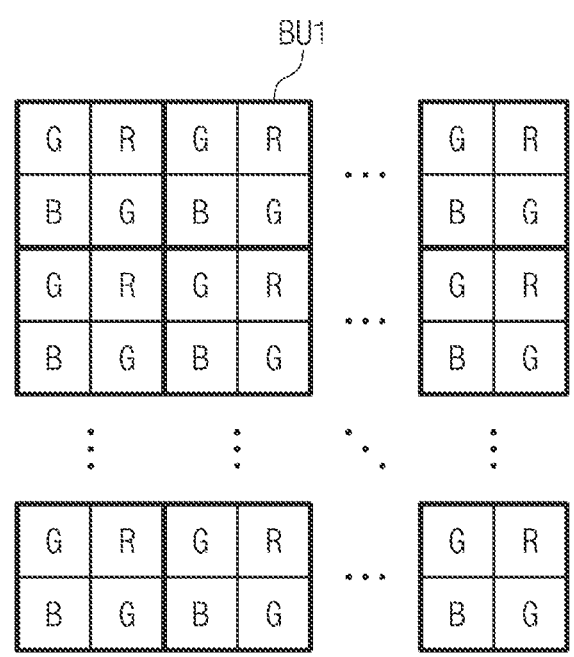
FIG. 3 illustrates an example in which color filters of a color filter array of FIG. 1 are arranged depending on a first-type array pattern according to an exemplary embodiment of the inventive concept.

FIG. 3 illustrates an example in which color filters of a color filter array of FIG. 1 are arranged depending on a first-type array pattern according to an exemplary embodiment of the inventive concept. Referring to FIGS. 1, 2, and 3, the color filter array 112 may include three color filters, e.g., red filters "R", green filters "G", and blue filters "B". The color filters of the color filter array 112 may be arranged in rows and columns in units of a first basic unit BU1, depending on the first-type array pattern.

The first basic unit BU1 may include four color filters. The first basic unit BU1 may include the green filter "G", the red filter "R", the green filter "G", and the blue filter "B" arranged sequentially in a clockwise direction from the left top. In an exemplary embodiment of the inventive concept, the first-type array pattern of the color filter array 112 may be a Bayer pattern.

Image data based on the Bayer pattern may be processed based on the first basic unit BU1. For example, an image based on the Bayer pattern may be converted into image data that is easy to process, for example, RGB data. In the conversion process, the first basic unit Bill may be used as one pixel data, and one R signal, one G signal, and one B signal may be generated from the one first basic unit BU1.

The Bayer pattern has been used as an array pattern of color filter arrays of image sensors for a long time. Accordingly, processors processing image data have been implemented to convert image data based on the Bayer pattern into RGB data.

As technology for manufacturing image sensors develops, the resolution of pixel arrays is increasing. As the resolution of pixel arrays increases, color filter arrays may be implemented to include color filters arranged according to an array pattern other than the Bayer pattern.

Figure 4:
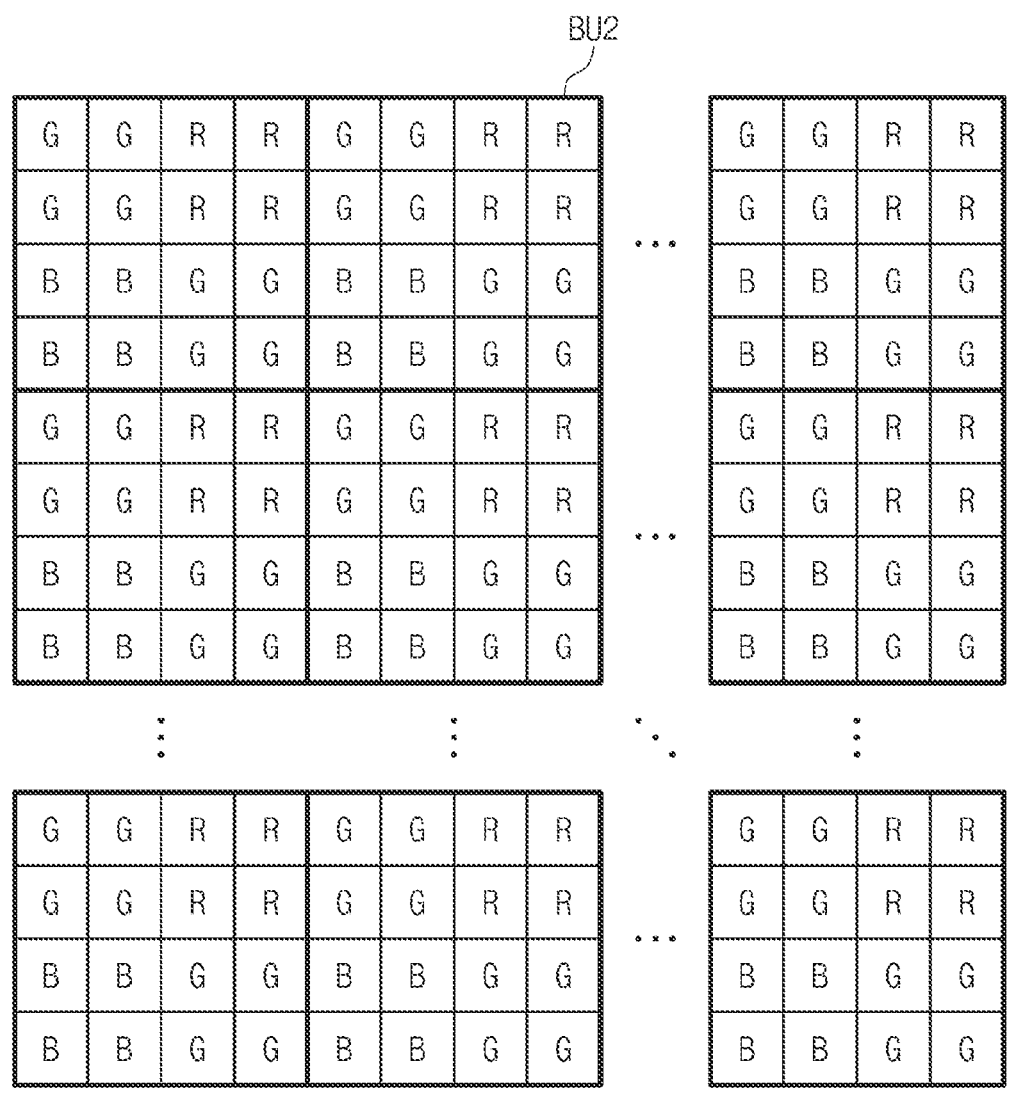

FIG. 4 illustrates an example in which color filters of the color filter array of FIG. 1 are arranged depending on a second-type array pattern according to an exemplary embodiment of the inventive concept. Referring to FIGS. 1, 2, and 4, the color filter array 112 may include three color filters, e.g., red filters "R", green filters "G", and blue filters "B". The color filters of the color filter array 112 may be arranged in rows and columns in units of a second basic unit BU2, according to the second-type array pattern.

The second basic unit BU2 may include 12 color filters. In the case of equally dividing the second basic unit BU2 into four quadrants based on a horizontal axis and a vertical axis, the second basic unit BU2 may include four G color filters placed at the upper left quadrant, four R color filters placed at the upper right quadrant, four B color filters placed at the lower left quadrant, and four G color filters placed at the lower right quadrant.

In an exemplary embodiment of the inventive concept, the second basic unit BU2 may include three or more color filters that are disposed adjacent to each other and correspond to the same color. The second-type array pattern of the color filter array 112 may not be the Bayer pattern.

For example, the second-type array pattern may be a non-Bayer pattern. The color filter array 112 of the image sensor 110 may include color filters arranged based on the non-Bayer pattern as illustrated in FIG. 4. Accordingly, the first image data ID1 fails to be processed by a general processor based on the non-Bayer pattern.

The first conversion block 124 and the second conversion block 125 may convert the first image data ID1 based on the non-Bayer pattern illustrated in FIG. 4 into the second image data ID2 based on the Bayer pattern illustrated in FIG. 3. The first area of the first image data ID1 may be converted by the first conversion block 124. The second area of the first image data ID1 may be converted by the second conversion block 125.

The third area of the first image data ID1 may be converted by the first conversion block 124 and the second conversion block 125. Through the first conversion block 124 and the second conversion block 125, the second image data ID2 based on the Bayer pattern corresponding to the first basic unit Bill may be generated from the first image data ID1 based on the non-Bayer pattern corresponding to the second basic unit BU2.

A detailed example of the non-Bayer pattern is illustrated in FIG. 4, but an array pattern of the color filter array 112 is not limited to the example illustrated in FIG. 4. The array pattern of the color filter array 112 may be implemented in various shapes including an array pattern called "tetra" or "nona".

Figure 5:
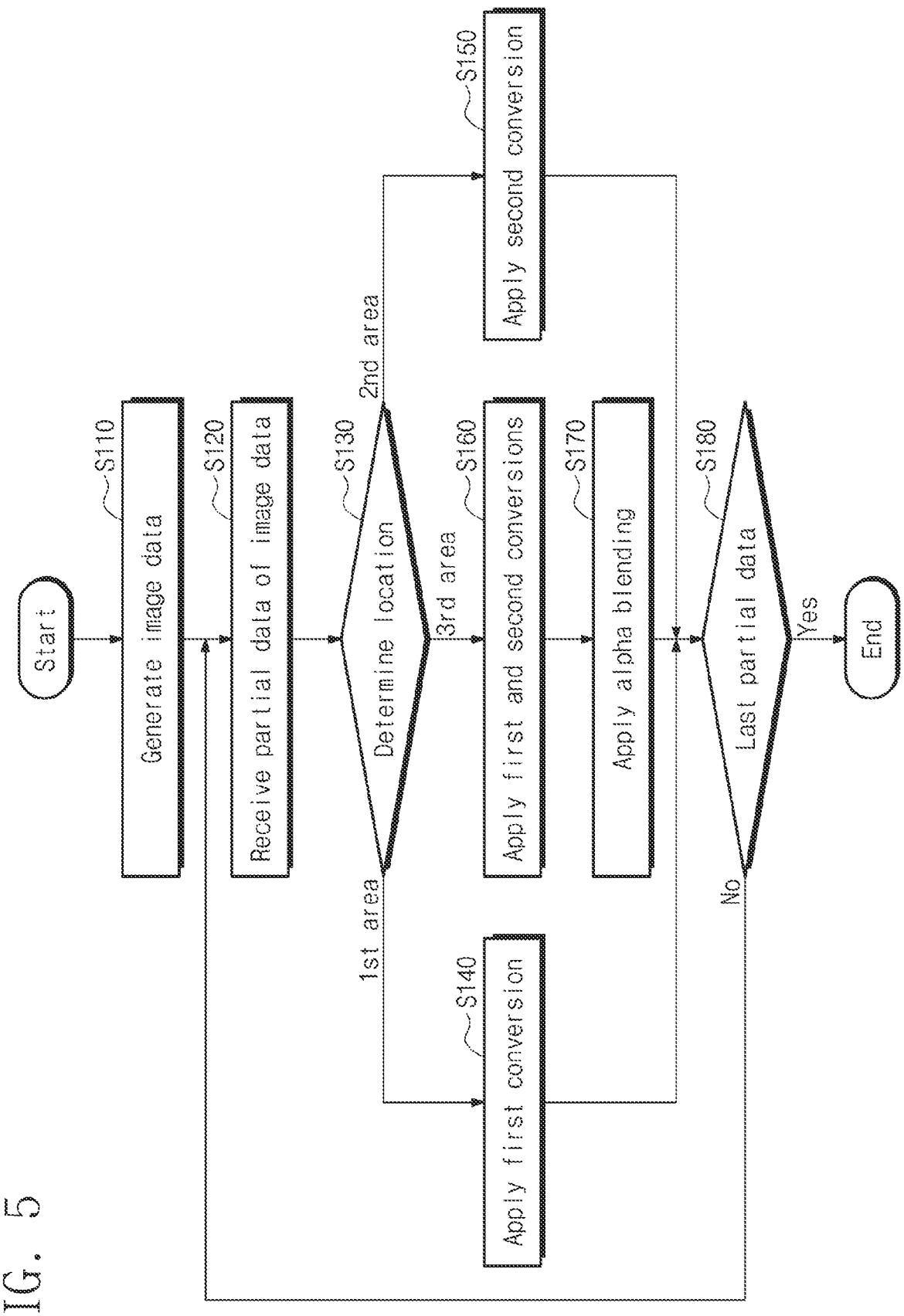
FIG. 5 illustrates an operating method of the electronic device of FIG. 1 according to an exemplary embodiment of the inventive concept.

FIG. 5 illustrates an operating method of the electronic device of FIG. 1 according to an exemplary embodiment of the inventive concept. Referring to FIGS. 1 and 5, in operation S110, the electronic device 100 may generate the first image data ID1. For example, the image sensor 110 may generate the first image data ID1 based on the non-Bayer pattern and may store the first image data ID1 in the first memory 121. The first image data ID1 may correspond to one frame.

In operation S120, the electronic device 100 may select partial data of the first image data ID1. For example, the selection block 123 of the processor 120 may receive partial data of the first image data ID1 stored in the first memory 121, e.g., partial data of one frame.

In operation S130, the electronic device 100 may determine a location of the received partial data. For example, the selection block 123 of the processor 120 may determine whether the received partial data belong to the first area, the second area, or the third area, based on the location information LI.

When the received partial data belong to the first area, the received partial data may belong to a location of image data that has the highest resolution. The selection block 123 may output the received partial data to the first conversion block 124 as a portion of the first partial image data ID1p1. In operation S140, the first conversion block 124 may apply the first conversion to the received partial data. The converted partial data may be transferred to the mixer 126 as a portion of the third partial image data ID2p1. The mixer 126 may store the converted partial data at a corresponding location of the second memory 127. Afterwards, operation S180 may be performed, which will be described below.

Returning to operation S130, when the received partial data belong to the second area, the received partial data may belong to a location of the image data that has the lowest resolution. The selection block 123 may output the received partial data to the second conversion block 125 as a portion of the second partial image data ID1p2. In operation S150, the second conversion block 125 may apply the second conversion to the received partial data. The converted partial data may be transferred to the mixer 126 as a portion of the fourth partial image data ID2p2. The mixer 126 may store the converted partial data at a corresponding location of the second memory 127. Afterwards, operation S180 may be performed.

Returning to operation S130, when the received partial data belong to the third area, the received partial data may belong to a location of the image data that has a resolution of an intermediate level. The selection block 123 may output the received partial data to the first conversion block 124 as a portion of the first partial image data ID1p1 and may output the received partial data to the second conversion block 125 as a portion of the second partial image data ID1p2. In operation S160, the first conversion block 124 may apply the first conversion to the received partial data, and the second conversion block 125 may apply the second conversion to the received partial data. The converted partial data may be transferred to the mixer 126 as a portion of the third partial image data ID2p1 and a portion of the fourth partial image data ID2p2.

When the partial data belong to the third area, in operation S170 following operation S160, the mixer 126 may perform the alpha blending on the converted partial data (e.g., first converted partial data) output from the first conversion block 124 and the converted partial data (e.g., second converted partial data) output from the second conversion block 125.

For example, the mixer 126 may apply a first transparency to the first converted partial data and may apply a second transparency to the second converted partial data. The mixer 126 may blend the first converted partial data to which the first transparency is applied and the second converted partial data to which the second transparency is applied, and may store the blended data at a corresponding location of the second memory 127.

In operation S180, the electronic device 100 may determine whether the conversion of last partial data of the image data is completed. When the conversion of last partial data of the image data is not completed, next partial data may be received in operation S120, and the conversion described with reference to operation S130 to operation S170 may be performed on the next partial data. When the conversion of the last partial data is completed, the electronic device 100 may terminate the conversion of the image data.

In other words, the processor 120 of the electronic device 100 may perform only the first conversion on image data in the first area of the first image data ID1 corresponding to one frame, and may perform only the second conversion on image data in the second area of the first image data ID1. The processor 120 may perform both the first conversion and the second conversion on image data in the third area of the first image data ID1 and may perform the alpha blending on a result of the first conversion and a result of the second conversion. As described above, the first conversion may include remosaic, interpolation, or directional interpolation, and the second conversion may include binning or upscale. In other words, the first conversion and the second conversion may be different.

In an exemplary embodiment of the inventive concept, the result of the second conversion may be used as background image data, and the result of the first conversion may be used as foreground image data. As another example, the result of the first conversion may be used as background image data, and the result of the second conversion may be used as foreground image data. The transparency of the foreground image data of the alpha blending, e.g., an alpha value, may be stored in the location information storage 122 together with the location information LI. The alpha value may be determined in a calibration of the image sensor 110.

Figure 6:
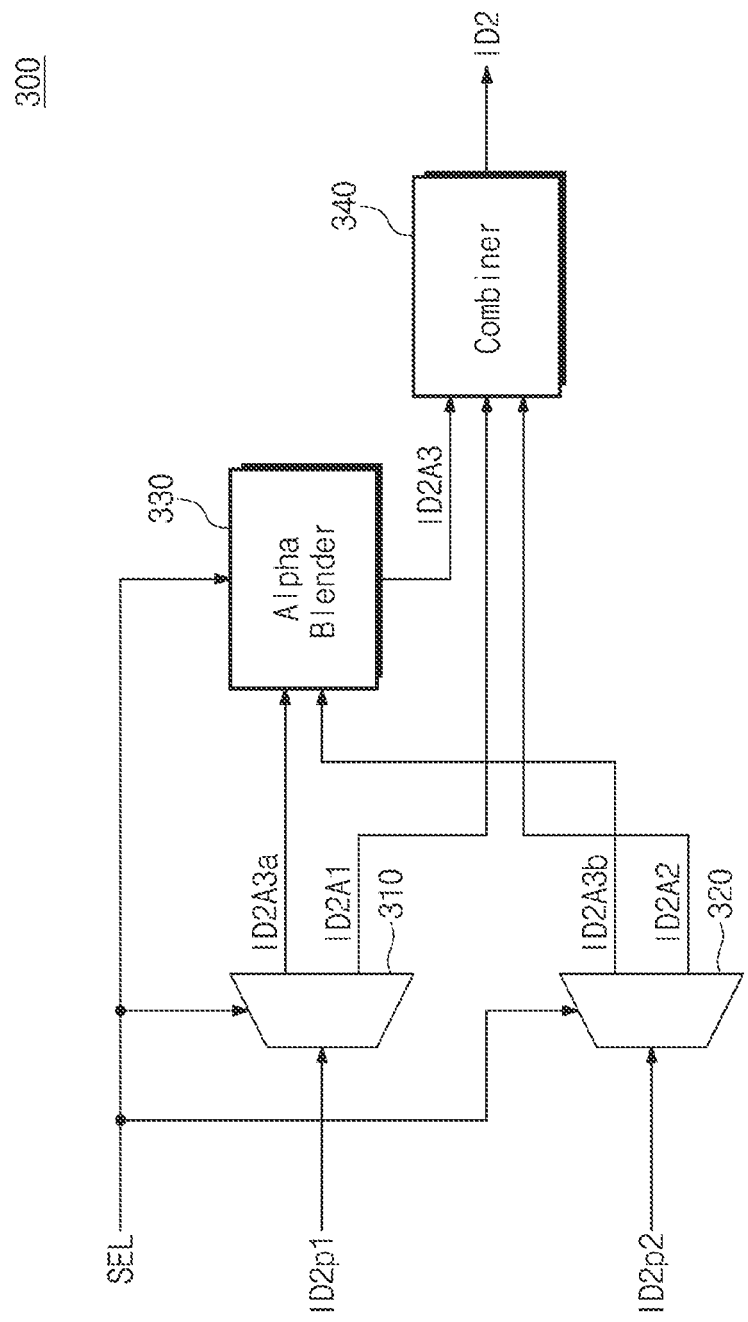
FIG. 6 illustrates a mixer according to an exemplary embodiment of the inventive concept.

FIG. 6 illustrates a mixer according to an exemplary embodiment of the inventive concept. A mixer 300 may correspond to the mixer 126 included in the processor 120 of the electronic device 100 of FIG. 1. Referring to FIGS. 1 and 6, the mixer 300 may include a first multiplexer 310, a second multiplexer 320, an alpha blender 330, and a combiner 340.

The first multiplexer 310 may receive the third partial image data ID2p1. In response to the selection signal SEL, the first multiplexer 310 may output partial data ID2A1 of the third partial image data ID2p1, which correspond to the first area, to the combiner 340, and may output partial data ID2A3a of the third partial image data ID2p1, which correspond to the third area, to the alpha blender 330.

The second multiplexer 320 may receive the fourth partial image data ID2p2. In response to the selection signal SEL, the second multiplexer 320 may output partial data ID2A2 of the fourth partial image data ID2p2, which correspond to the second area, to the combiner 340, and may output partial data ID2A3b of the fourth partial image data ID2p2, which correspond to the third area, to the alpha blender 330.

The alpha blender 330 may perform the alpha blending on the partial data ID2A3a received from the first multiplexer 310 and the partial data ID2A3b received from the second multiplexer 320. The alpha blender 330 may output a result of the alpha blending as partial data ID2A3, corresponding to the third area, to the combiner 340.

The combiner 340 may receive the partial data ID2A1 corresponding to the first area from the first multiplexer 310 and may receive the partial data ID2A2 corresponding to the second area from the second multiplexer 320. The combiner 340 may receive the partial data ID2A3 corresponding to the third area from the alpha blender 330. The combiner 340 may combine the received data (e.g., ID2A1, ID2A2, and ID2A3) to output the second image data ID2 in units of frames.

Figure 7:
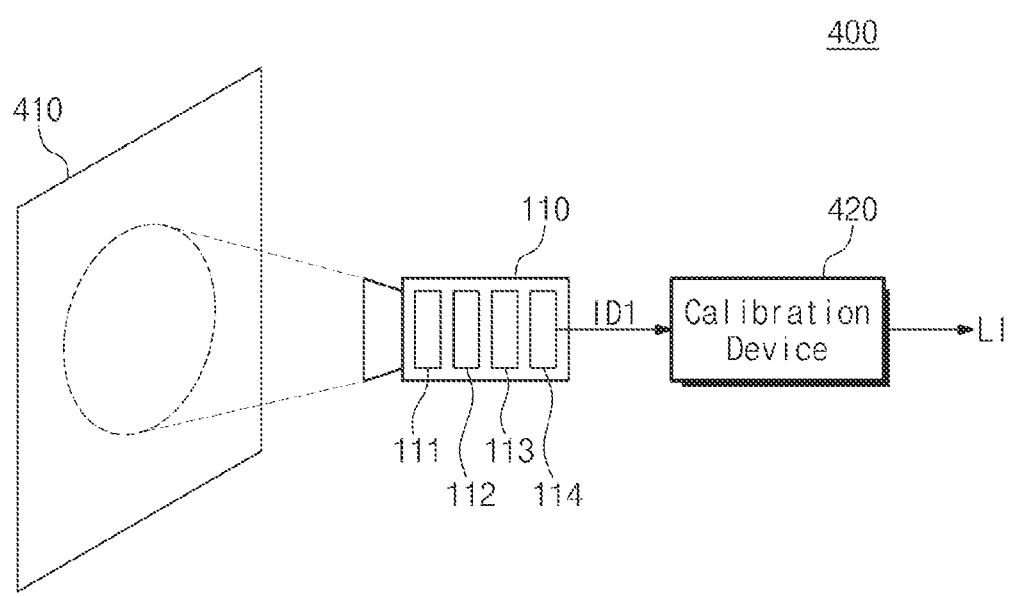
FIG. 7 illustrates a calibration system for calibrating an image sensor according to an exemplary embodiment of the inventive concept.

FIG. 7 illustrates a calibration system for calibrating the image sensor of FIG. 1 according to an exemplary embodiment of the inventive concept. Referring to a calibration system 400 illustrated in FIG. 7, after the image sensor 110 is manufactured, the image sensor 110 may be connected with a calibration device 420 for calibration. In calibration, a calibration sheet 410 may be photographed by using the image sensor 110. The calibration sheet 410 may include various patterns corresponding to various resolutions. The calibration device 420 may perform calibration based on a result of photographing the calibration sheet 410 by the image sensor 110.

For example, the calibration may include calibrating a slope of the lens 111 of the image sensor 110, and adjusting a distance between the lens 111 and the pixel array 113 to calibrate a resolution. Additionally, the calibration may include determining the first area, the second area, and the third area of image data generated by the image sensor 110. The calibration device 420 may generate the location information LI including information of the first area, the second area, and the third area.

The calibration may further include determining a transparency to be applied to the third area, e.g., an alpha value. The location information LI and the alpha value may be stored in the location information storage 122 without modification or with subsequent revision by a manufacturer of the electronic device 100 (refer to FIG. 1) (e.g., based on a process characteristic or a product characteristic of the manufacturer).

Figure 8:
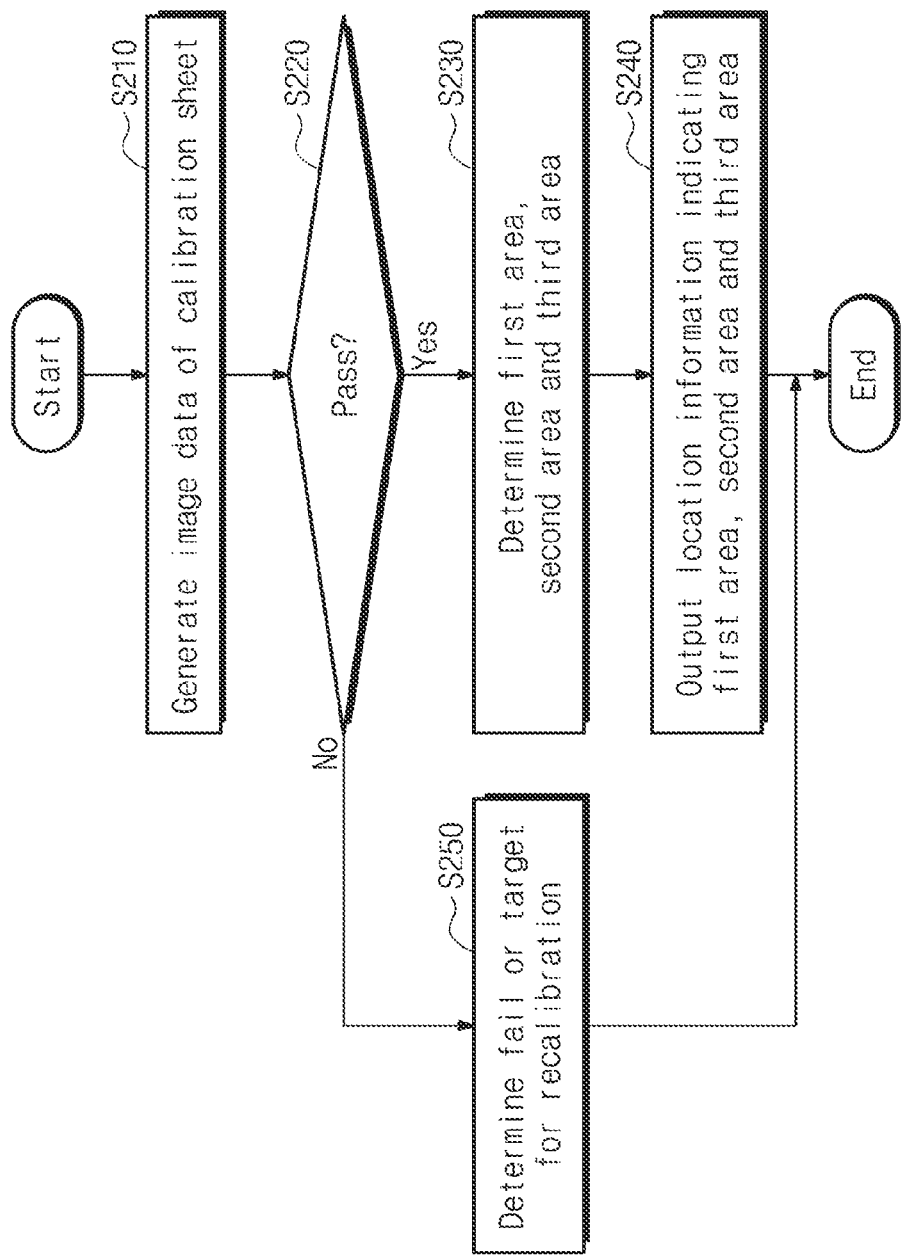
FIG. 8 illustrates an operating method of the calibration system of FIG. 7 according to an exemplary embodiment of the inventive concept.

FIG. 8 illustrates an operating method of the calibration system of FIG. 7 according to an exemplary embodiment of the inventive concept. Referring to FIGS. 7 to 8, in operation S210, the calibration system 400 may generate image data of the calibration sheet 410 by using the image sensor 110.

In operation S220, the calibration device 420 may calibrate the image sensor 110 and may determine whether the calibration of the image sensor 110 passes. For example, when a resolution (or an image quality) of image data generated by the image sensor 110 thus calibrated is higher than or equal to a threshold value, the image sensor 110 may be determined as passing the calibration.

When it is determined that the image sensor 110 passes the calibration, in operation S230, the calibration device 420 may determine the first area, the second area, and the third area of first image data generated by the image sensor 110, and may determine an alpha value to be applied to the third area.

In operation S240, the calibration device 420 may output the location information LI indicating the first area, the second area, and the third area, and the alpha value. For example, when the image sensor 110 is coupled to the processor 120, the location information LI and the alpha value may be stored in the location information storage 122 of the processor 120. In the case where the image sensor 110 is provided to a manufacturer of the electronic device 100 without coupling to the processor 120, the location information LI and the alpha value may be provided to the manufacturer together.

When it is determined in operation S220 that the image sensor 110 does not pass the calibration, operation S250 is performed. In operation S250, the calibration device 420 may determine a calibration fail or may determine the image sensor 110 as a recalibration target. When the calibration fail is determined, the image sensor 110 may be discarded or may be reused in a product providing a lower resolution (or image quality). When the image sensor 110 is targeted for recalibration, the recalibration may be performed on the image sensor 110, or the recalibration may be reserved.

Figure 9:
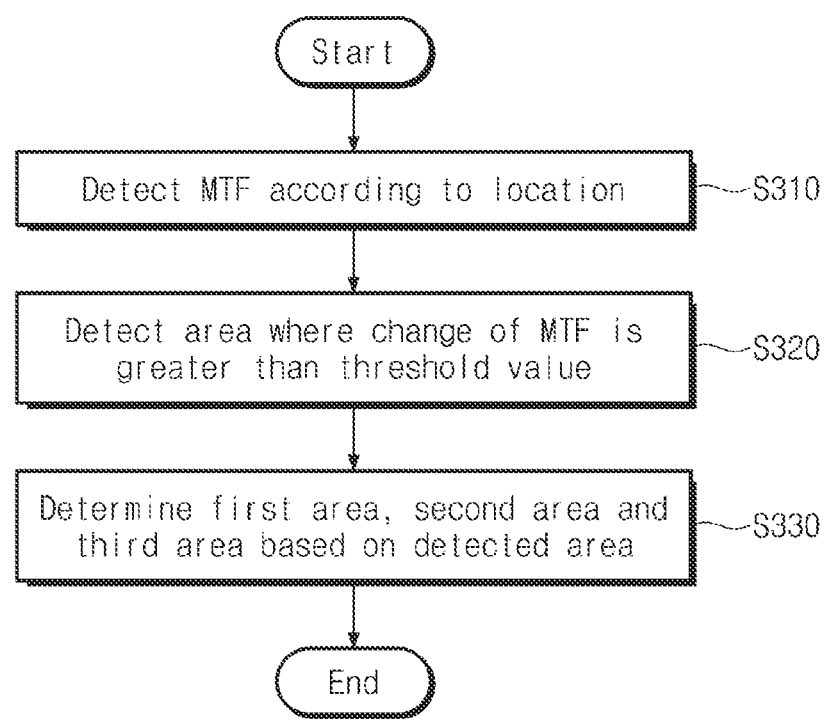
FIG. 9 illustrates an example in which a calibration device of FIG. 7 determines a first area, a second area, and a third area according to an exemplary embodiment of the inventive concept.

FIG. 9 illustrates an example in which a calibration device of FIG. 7 determines a first area, a second area, and a third area according to an exemplary embodiment of the inventive concept. Referring to FIGS. 1, 7, and 9, in operation S310, the calibration device 420 may detect a modulation transfer function (MTF) according to a location on the first image data ID1 of the image sensor 110.

In operation S320, the calibration device 420 may detect an area where a change of the MTF is greater than a threshold value. For example, the calibration device 420 may detect an area where the variations in the MTF for a unit length according to a specific coordinate axis on the first image data ID1 are greater than the threshold value. As another example, the calibration device 420 may detect an area where an instantaneous rate of change of the MTF is greater than the threshold value.

In operation S330, the calibration device 420 may determine the first area, the second area, and the third area based on the detected area. For example, the calibration device 420 may determine the detected area as the third area. The calibration device 420 may determine an area having an MTF higher than an MTF of the detected area as the first area. The calibration device 420 may determine an area having an MTF lower than the MTF of the detected area as the second area.

Figure 10:
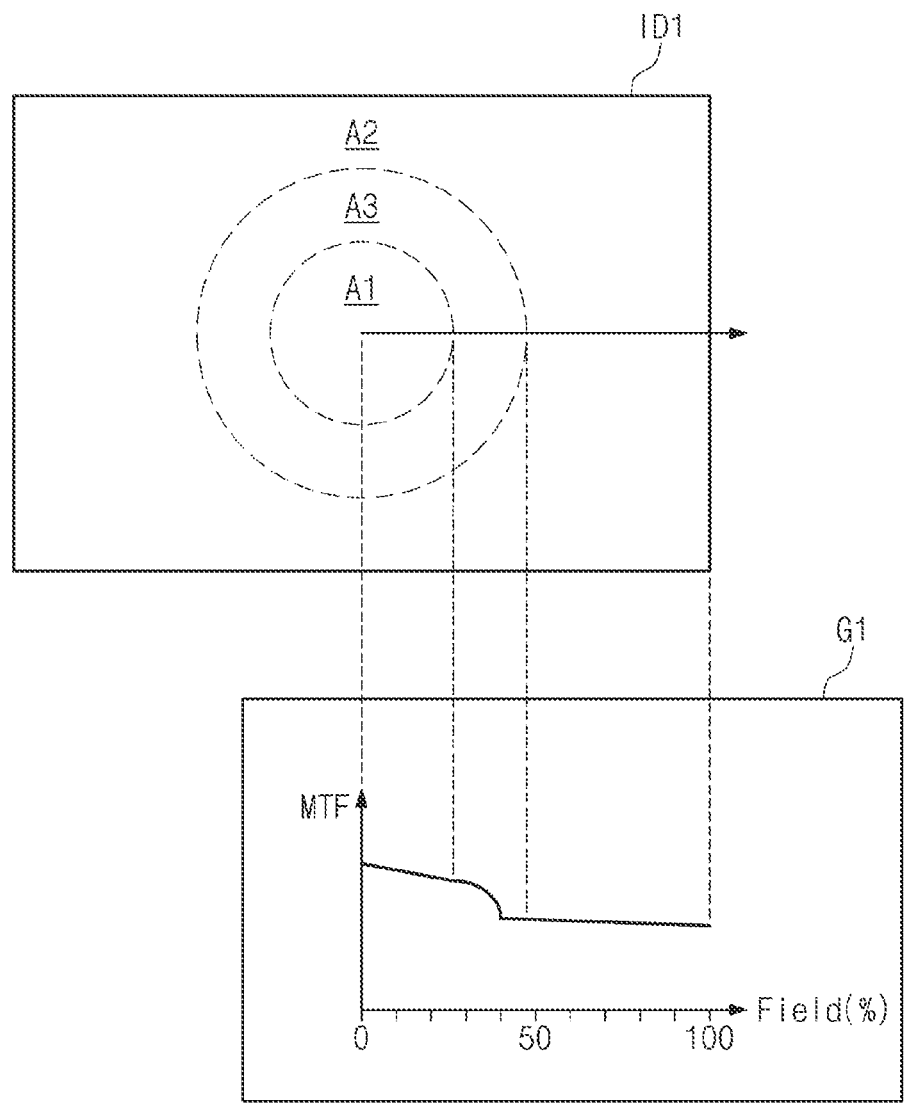
FIG. 10 illustrates a change of a modulation transfer function (MTF) according to a location on first image data according to an exemplary embodiment of the inventive concept.

FIG. 10 illustrates a change of an MTF according to a location on the first image data according to an exemplary embodiment of the inventive concept. Referring to FIGS. 1 and 10, a location on the first image data ID1 may be expressed by a field. The field may indicate a distance from the center of the first image data ID1.

For example, the field may be a ratio of a distance from the center on the first image data ID1 to a long side (or a short side) of the first image data ID1. In other words, the field indicating a location on the first image data ID1 may indicate a radial distance from the center.

A horizontal axis of a first graph G1 matched with the first image data ID1 indicates a field on the first image data ID1, and a vertical axis thereof indicates an MTF. For example, a unit of the MTF may be a cycle per pixel (cycle/pixel).

As illustrated in FIG. 10, an area where a change of the MTF is greater than a threshold value may be defined as a third area A3. An area having an MTF greater than the MTF of the third area A3 may be defined as a first area A1. An area having an MTF smaller than the MTF of the third area A3 may be defined as a second area A2.

As a curvature of the lens 111 increases and pitches of pixels of the pixel array 113 are smaller than an airy disk, a change of the MTF according to a location on the first image data ID1 increases.

The resolution and the quality of the second image data ID2 may be improved by applying the first conversion block 124 having high-quality and high-power characteristics to image data of the first area A1 having a relatively high resolution.

Power consumption may be reduced in the process of generating the second image data ID2 by applying the second conversion block 125 having low-quality and low-power characteristics to image data of the second area A2 having a relatively low resolution.

In other words, the first area A1 and the second area A2 are different areas having different resolutions. The first conversion performed by the first conversion block 124 (e.g., remosaic, interpolation, or directional interpolation) generates image data having a resolution higher than that of image data generated by the second conversion performed by the second conversion block 125 (e.g., binning or upscale). On the other hand, the second conversion consumes less power than the first conversion. As such, the electronic device 100 may adaptively or selectively perform the first conversion and the second conversion depending on a location (e.g., different areas) on the first image data ID1 to generate the second image data ID2, which generates a higher resolution image as compared to when only performing the second conversion and consumes less power as compared to when only performing the first conversion. This will be described in further detail below with reference to Equations 1 to 3 and Tables 1 and 2.

With regard to image data of the third area A3 where a change of the MTF is great, as the alpha blending is applied to a conversion result of the first conversion block 124 and a conversion result of the second conversion block 125, it may be possible to prevent an unintended pattern from occurring at a boundary of the first area A1 and the second area A2 on the second image data ID2 and to prevent a resolution and an image quality from sharply changing.

As the field radially indicates a location on the first image data ID1, the first area A1 may be a circle, and the second area A2 and the third area A3 may include a remaining area of the first image data ID1, which surrounds the first area A1. For example, the third area A3 may be a concentric circle surrounding the first area A1, and the second area A2 may be the remaining area surrounding the first area A1 and the third area A3.

In an exemplary embodiment of the inventive concept, an alpha value to be applied to the third area A3 may be determined by the calibration device 420 based on various factors such as a value (e.g., an intermediate value, an average, or variations) of an MTF of the third area A3, a relationship (e.g., a ratio) of the value of the MTF of the third area A3 and a value (e.g., an intermediate value, an average, or variations) of an MTF of the first area A1, and a relationship (e.g., a ratio) of the value of the MTF of the third area A3 and a value (e.g., an intermediate value, an average, or variations) of an MTF of the second area A2. For example, the calibration device 420 may be configured to determine an alpha value through a machine learning-based inference on values of an MTF.

As another example, due to a characteristic of a spherical convex lens, a resolution of a central portion on the first image data ID1 may be the highest. Accordingly, the central portion on the first image data ID1 may be determined as the first area A1.

Likewise, due to the characteristic of the spherical convex lens, a resolution of an outer portion on the first image data ID1 may be the lowest. Accordingly, the outer portion on the first image data ID1 may be determined as the second area A2. An area between the first area A1 and the second area A2 may be determined as the third area A3. In the third area A3, first converted partial data and second converted partial data may be blended by the alpha blending.

When the first conversion block 124 and the second conversion block 125 according to an exemplary embodiment of the inventive concept are adaptively used, power consumption may be expressed by Equation 1 below.

$$P = A1 \cdot P1 + A2 \cdot P2 + A3(P1 + P2) \quad \text{[Equation 1]}$$

In Equation 1 above, "A1" may be the area of the first area A1, "A2" may be the area of the second area A2, and "A3" may be the area of the third area A3. "P1" may be power consumption of the first conversion block 124, and "P2" may be power consumption of the second conversion block 125. In general, the power consumption of the second conversion block 125 may correspond to about 10% of the power consumption of the first conversion block 124. Accordingly, Equation 1 may be summarized as the following Equation 2.

$$P = A1 \cdot P1 + A2 \cdot 0.1 P1 + A3(P1 + 0.1 P1) \quad \text{[Equation 2]}$$

Equation 2 above may be summarized as the following Equation 3.

$$P = P1(A1 + 0.1 A2 + 1.1 A3) \quad \text{[Equation 3]}$$

Because the area of the second area A2 is the largest on the first image data ID1, power consumption may be reduced as much as about 48.3% compared to when only the first conversion is performed. Accordingly, the power consumption of the electronic device 100 may be reduced.

Table 1 below shows the MTF when the first conversion is performed, when the second conversion is performed, and when the first conversion and the second conversion according to exemplary embodiments of the inventive concept are adaptively performed.

TABLE 1

| | First conversion | | | Second conversion | | | First conversion and second conversion | | |
|---|---|---|---|---|---|---|---|---|---|
| | MTF50 | MTF30 | MTF10 | MTF50 | MTF30 | MTF10 | MTF50 | MTF30 | MTF10 |
| Center | 0.2324 | 0.2819 | 0.3662 | 0.1845 | 0.2125 | 0.2460 | 0.2324 | 0.2819 | 0.3662 |
| 0.5 field | 0.1915 | 0.2776 | 0.3375 | 0.1541 | 0.1977 | 0.2424 | 0.1667 | 0.2370 | 0.2958 |
| 0.8 field | 0.1974 | 0.2148 | 0.2453 | 0.1874 | 0.1969 | 0.213 | 0.1874 | 0.1969 | 0.213 |

From the information described in Table 1, a decrease in a resolution (or image quality) compared to when the first conversion is performed is indicated by Table 2 below.

TABLE 2

| | Second conversion | | | First conversion and second conversion | | |
|---|---|---|---|---|---|---|
| | MTF50 | MTF30 | MTF10 | MTF50 | MTF30 | MTF10 |
| Center | 79.39% | 75.38% | 67.18% | 100% | 100% | 100% |
| 0.5 field | 80.47% | 71.82% | 87.08% | 87.08% | 85.36% | 87.65% |
| 0.8 field | 94.93% | 91.67% | 86.83% | 94.93% | 91.67% | 86.83% |

As shown in Table 2 above, as the first conversion and the second conversion according to exemplary embodiments of the inventive concept are adaptively applied, the electronic device 100 generates the first image data ID1 having an improved resolution (or image quality) as compared to when only the second conversion is applied, and reduces power consumption as compared to when only the first conversion is applied.

The above numerical values may be used in an exemplary environment of the inventive concept and may vary depending on a size of the first area A1, a size of the second area A2, a size of the third area A3, the number of sub-areas of the third area A3, sizes of the sub-areas of the third area A3, and an alpha value to be applied to the third area A3.

Figure 11:
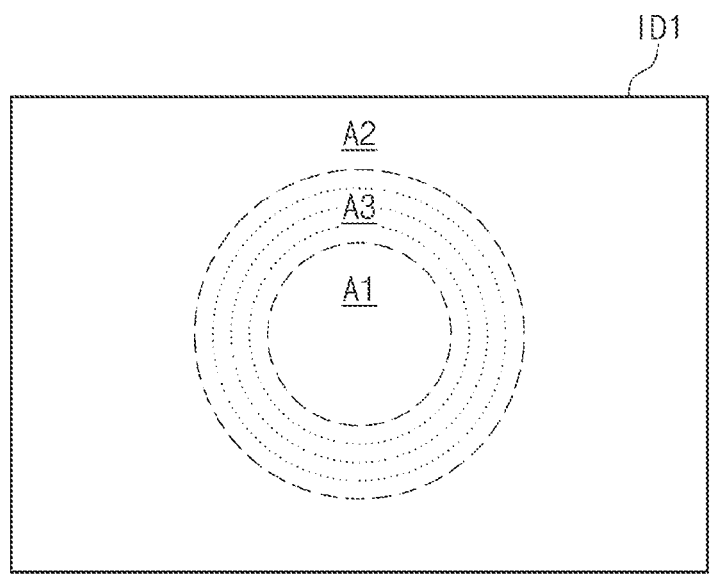
FIG. 11 illustrates an example in which a third area is divided into sub-areas according to an exemplary embodiment of the inventive concept.

FIG. 11 illustrates an example in which a third area is divided into sub-areas according to an exemplary embodiment of the inventive concept. Referring to FIGS. 1, 7, and 11, the third area A3 may be divided into sub-areas depending on a distance from the center. Each of the sub-areas may be in the form of a concentric circle surrounding the first area A1.

The sub-areas may be specified to have different alpha values. For example, as a location of a sub-area becomes closer to the first area A1, an alpha value may decrease (or increase). As a location of a sub-area becomes closer to the second area A2, an alpha value may increase (or decrease).

In other words, as an example, for one sub-area of the third area A3, the first conversion block 124 may perform the first conversion to output the third partial image data ID2$p$1, and the second conversion block 125 may perform the second conversion to output the fourth partial image data ID2$p$, as described with reference to FIG. 1. The alpha blender 330 may perform the alpha blending on the partial data ID2A3a of the third partial image data ID2p and the partial data ID2A3b of the fourth partial image data ID2p2 to output the partial data ID2A3 (e.g., fifth partial image data), as described with reference to FIG. 6. For another sub-area of the third area A3, the first conversion block 124 may perform the first conversion to output sixth partial image data, the second conversion block 125 may perform the second conversion to output to output seventh partial image data, and the alpha blender 330 may perform the alpha blending on the sixth partial image data and the seventh partial image data to generate eighth partial image data. In this case, an alpha value applied to the fifth partial image data and an alpha value applied to the eighth partial image data are different.

In an exemplary embodiment of the inventive concept, an output of the first conversion block 124 may be used as foreground image data, and an output of the second conversion block 125 may be used as background image data. In this case, as a location of a sub-area becomes closer to the first area A1, an alpha value of the foreground image data may decrease. As a location of a sub-area becomes closer to the second area A2, an alpha value of the foreground image data may increase.

As another example, an output of the first conversion block 124 may be used as background image data, and an output of the second conversion block 125 may be used as foreground image data. In this case, as a location of a sub-area becomes closer to the first area A1, an alpha value of the foreground image data may increase. As a location of a sub-area becomes closer to the second area A2, an alpha value of the foreground image data may decrease.

Figure 12:
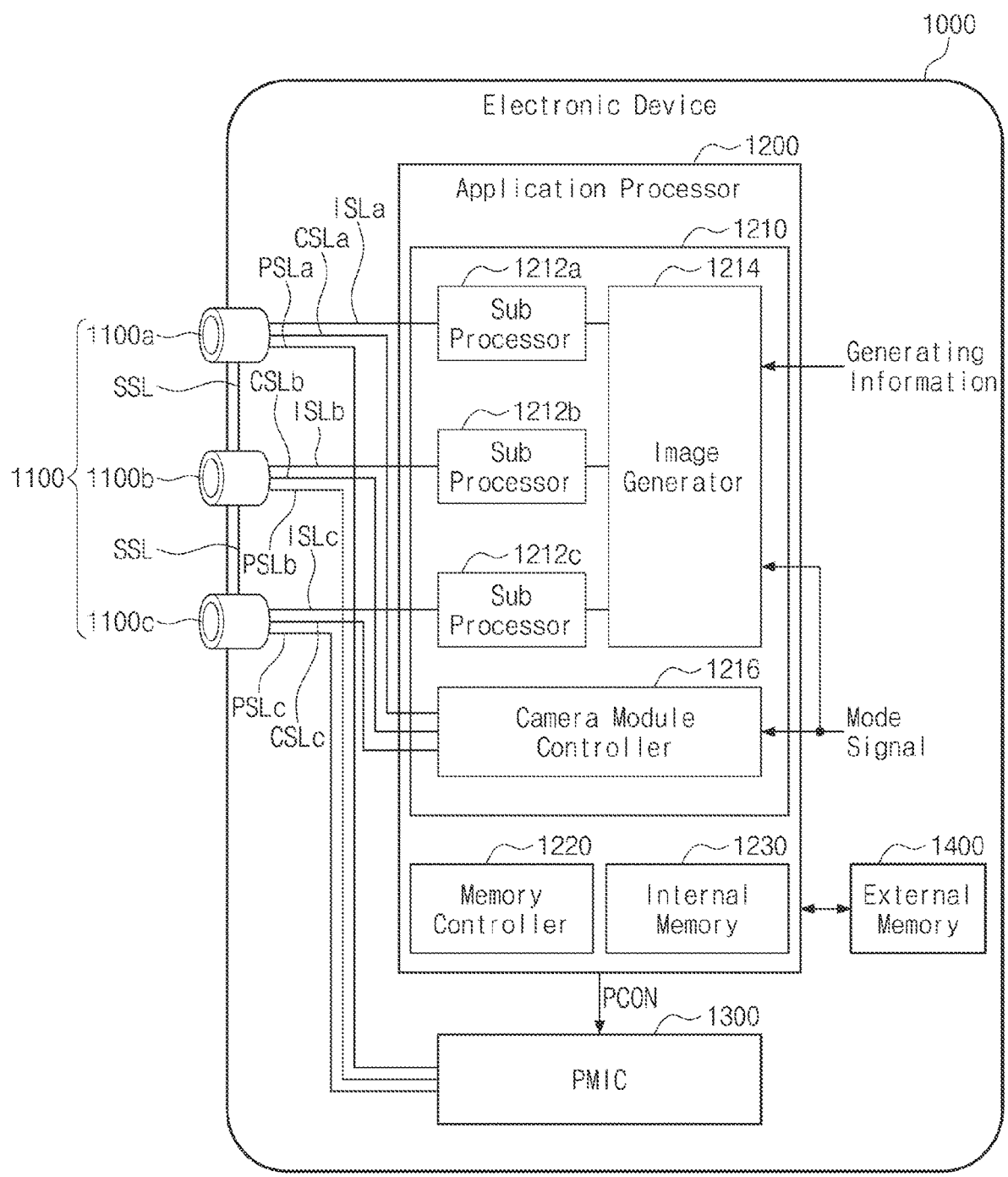
FIG. 12 is a block diagram of an electronic device including a multi-camera module according to an exemplary embodiment of the inventive concept.
Figure 13:
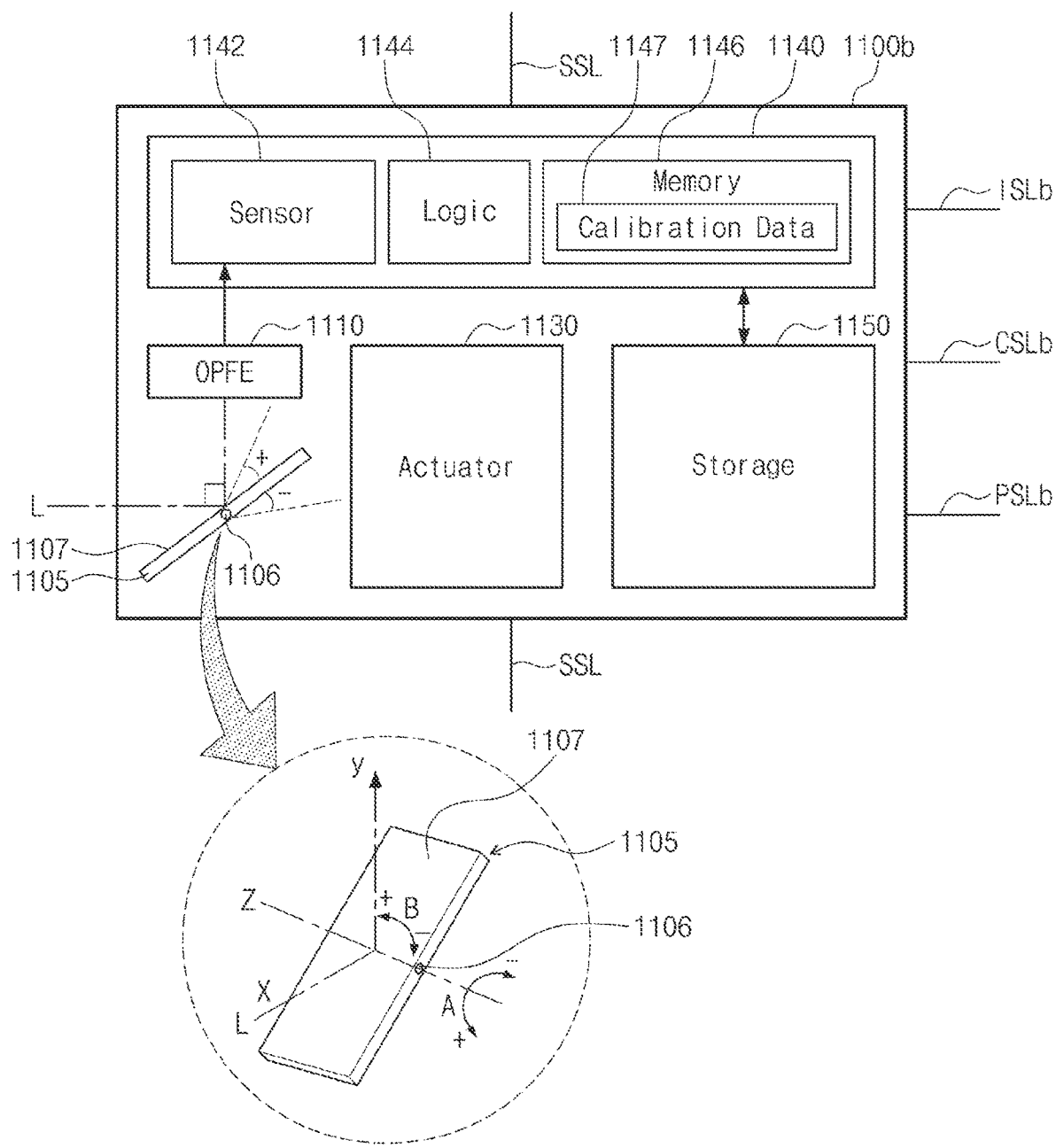
FIG. 13 is a detailed block diagram of a camera module of FIG. 12 according to an exemplary embodiment of the inventive concept.

FIG. 12 is a block diagram of an electronic device including a multi-camera module according to an exemplary embodiment of the inventive concept. FIG. 13 is a detailed block diagram of a camera module of FIG. 12 according to an exemplary embodiment of the inventive concept.

Referring to FIG. 12, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. An exemplary embodiment in which three camera modules 1100a, 1100b, and 1100c are disposed is illustrated in FIG. 12, but the inventive concept is not limited thereto. In exemplary embodiments of the inventive concept, the camera module group 1100 may be modified to include only two camera modules. Additionally, in exemplary embodiments of the inventive concept, the camera module group 1100 may be modified to include "n" camera modules (where n is a natural number of 4 or more). In an exemplary embodiment of the inventive concept, each of the plurality of camera modules 1100a, 1100b, and 1100c of the camera module group 1100 may include the electronic device 100 of FIG. 1.

Below, a detailed configuration of the camera module 1100b will be more fully described with reference to FIG. 13, but the following description may be equally applied to the remaining camera modules 1100a and 1100c.

Referring to FIG. 13, the camera module 1100b may include a prism 1105, an optical path folding element (OPFE) 1110, an actuator 1130, an image sensing device 1140, and a storage unit 1150.

The prism 1105 may include a reflecting plane 1107 of a light reflecting material, and may change a path of a light "L" incident from the outside.

In exemplary embodiments of the inventive concept, the prism 1105 may change a path of the light "L" incident in a first direction "X" to a second direction "Y" perpendicular to the first direction "X". Additionally, the prism 1105 may change the path of the light "L" incident in the first direction "X" to the second direction "Y" perpendicular to the first direction "X" by rotating the reflecting plane 1107 of the light reflecting material in a direction "A" about a central axis 1106 or rotating the central axis 1106 in a direction "B". In this case, the OPPE, 1110 may move in a third direction "Z" perpendicular to the first direction "X" and the second direction "Y".

In exemplary embodiments of the inventive concept, as illustrated, a maximum rotation angle of the prism 1105 in the direction "A" may be less than or equal to about 15 degrees in a positive A direction, and may be greater than about 15 degrees in a negative A direction, but the inventive concept is not limited thereto.

In exemplary embodiments of the inventive concept, the prism 1105 may move within approximately 20 degrees in a positive or negative B direction, between approximately 10 degrees and approximately 20 degrees, or between approximately 15 degrees and approximately 20 degrees; here, the prism 1105 may move at the same angle in the positive or negative B direction or may move at a similar angle within approximately 1 degree.

In exemplary embodiments of the inventive concept, the prism 1105 may move the reflecting plane 1107 of the light reflecting material in the third direction (e.g., the Z direction) substantially parallel to a direction in which the central axis 1106 extends.

The OPFE 1110 may include optical lenses composed of "m" groups (where m is a natural number), for example. Here, "m" optical lenses may move in the second direction "Y" to change an optical zoom ratio of the camera module 1100b. For example, when a default optical zoom ratio of the camera module 1100b is "Z", the optical zoom ratio of the camera module 1100b may be changed to an optical zoom ratio of 3Z, 5Z, or 5Z or more, by moving the "m" optical lenses included in the OPFE 1110.

The actuator 1130 may move the OPFE 1110 or an optical lens (hereinafter referred to as an "optical lens") to a specific location. For example, the actuator 1130 may adjust a location of an optical lens such that an image sensor 1142 is placed at a focal length of the optical lens for accurate sensing.

The image sensing device 1140 may include the image sensor 1142, control logic 1144, and a memory 1146. The image sensor 1142 may sense an image of a sensing target by using the light "L" provided through an optical lens. The control logic 1144 may control overall operations of the camera module 1100b. For example, the control logic 1144 may control an operation of the camera module 1100b based on a control signal provided through a control signal line CSLb.

The memory 1146 may store information for an operation of the camera module 1100b, such as calibration data 1147. The calibration data 1147 may include information for the camera module 1100b to generate image data by using the light "L" provided from the outside. The calibration data 1147 may include, for example, information about the degree of rotation described above, information about a focal length, information about an optical axis, etc. In the case where the camera module 1100b is implemented in the form of a multi-state camera in which a focal length varies depending on a location of an optical lens, the calibration data 1147 may include a focal length value for each location (or state) of the optical lens and information about auto focusing.

The storage unit 1150 may store image data sensed through the image sensor 1142. The storage unit 1150 may be disposed outside the image sensing device 1140 and may be implemented in a shape where the storage unit 1150 and a sensor chip constituting the image sensing device 1140 are stacked. In exemplary embodiments of the inventive concept, the storage unit 1150 may be implemented with an electrically erasable programmable read only memory (EEPROM), but the inventive concept is not limited thereto. Referring to FIGS. 12 and 13 together, in exemplary embodiments of the inventive concept, each of the plurality of camera modules 1100a, 1100b, and 1100c may include the actuator 1130. As such, the same calibration data 1147 or different calibration data 1147 may be included in the plurality of camera modules 1100a, 1100b, and 1100c depending on operations of the actuators 1130 therein.

In exemplary embodiments of the inventive concept, one camera module (e.g., 1100b) among the plurality of camera modules 1100a, 1100b, and 1100c may be a camera module having a folded lens shape in which the prism 1105 and the OPFE 1110 described above are included, and the remaining camera modules (e.g., 1100a and 1100c) may each be a camera module having a vertical shape in which the prism 1105 and the OPFE 1110 described above are not included; however, the inventive concept is not limited thereto.

In exemplary embodiments of the inventive concept, one camera module (e.g., 1100c) among the plurality of camera modules 1100a, 1100b, and 1100c may be, for example, depth camera having a vertical shape extracting depth information by using an infrared ray (IR). In this case, the application processor 1200 may merge image data provided from the depth camera and image data provided from any other camera module (e.g., 1100a or 1100b), and may generate a three-dimensional (3D) depth image.

In exemplary embodiments of the inventive concept, at least two camera modules (e.g., 1100a and 1100b) among the plurality of camera modules 1100a, 1100b, and 1100c may have different fields of view. In this case, the at least two camera modules (e.g., 1100a and 1100b) among the plurality of camera modules 1100a, 1100b, and 1100c may include different optical lens, but the inventive concept is not limited thereto.

Additionally, in exemplary embodiments of the inventive concept, fields of view of the plurality of camera modules 1100a, 1100b, and 1100c may be different. In this case, the plurality of camera modules 1100a, 1100b, and 1100c may include different optical lens, but the inventive concept is not limited thereto.

In exemplary embodiments of the inventive concept, the plurality of camera modules 1100a, 1100b, and 1100c may be disposed to be physically separated from one another. In other words, the plurality of camera modules 1100a, 1100b, and 1100c may not use a sensing area of one image sensor 1142, but the plurality of camera modules 1100a, 1100b, and 1100c may include independent image sensors 1142 therein, respectively.

Returning to FIG. 12, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented with separate semiconductor chips.

The image processing device 1210 may include a plurality of sub image processors 1212a, 1212b, and 1212c, an image generator 1214, and a camera module controller 1216.

The image processing device 1210 may include the plurality of sub image processors 1212a, 1212b, and 1212c, the number of which corresponds to the number of the plurality of camera modules 1100a, 1100b, and 1100c.

Image data generated from the camera modules 1100a, 1100b, and 1100c may be respectively provided to the corresponding sub image processors 1212a, 1212b, and 1212c through separated image signal lines ISLa, ISLb, and ISLc. For example, the image data generated from the camera module 1100a may be provided to the sub image processor 1212a through the image signal line ISLa, the image data generated from the camera module 1100b may be provided to the sub image processor 1212b through the image signal line ISLb, and the image data generated from the camera module 1100c may be provided to the sub image processor 1212c through the image signal line ISLc. This image data transmission may be performed, for example, by using a camera serial interface (CSI) based on the MIPI (Mobile Industry Processor Interface) specification, but the inventive concept is not limited thereto.

Meanwhile, in exemplary embodiments of the inventive concept, one sub image processor may be disposed to correspond to a plurality of camera modules. For example, the sub image processor 1212a and the sub image processor 1212c may be integrally implemented, not separated from each other as illustrated in FIG. 12; in this case, one of the pieces of image data respectively provided from the camera module 1100a and the camera module 1100c may be selected through a selection element (e.g., a multiplexer), and the selected image data may be provided to the integrated sub image processor.

The image data respectively provided to the sub image processors 1212a, 1212b, and 1212c may be provided to the image generator 1214. The image generator 1214 may generate an output image by using the image data respectively provided from the sub image processors 1212a, 1212b, and 1212c, depending on generating information (or image generating information) or a mode signal.

In detail, the image generator 1214 may generate the output image by merging at least a portion of the image data respectively generated from the camera modules 1100a, 1100b, and 1100c having different fields of view, depending on the generating information or the mode signal. Additionally, the image generator 1214 may generate the output image by selecting one of the image data respectively generated from the camera modules 1100a, 1100b, and 1100c having different fields of view, depending on the generating information or the mode signal.

In exemplary embodiments of the inventive concept, the generating information may include a zoom signal or a zoom factor. Additionally, in exemplary embodiments of the inventive concept, the mode signal may be, for example, a signal based on a mode selected from a user.

In the case where the generating information is the zoom signal (or zoom factor) and the camera modules 1100a, 1100b, and 1100c have different visual fields (or fields of view), the image generator 1214 may perform different operations depending on a kind of the zoom signal. For example, in the case where the zoom signal is a first signal, the image generator 1214 may merge the image data output from the camera module 1100a and the image data output from the camera module 1100c, and may generate the output image by using the merged image signal and the image data output from the camera module 1100b that is not used in the merging operation. In the case where the zoom signal is a second signal different from the first signal, without the image data merging operation, the image generator 1214 may select one of the image data respectively output from the camera modules 1100a, 1100b, and 1100c, and may output the selected image data as the output image. However, the inventive concept is not limited thereto, and a way to process image data may be modified without limitation if necessary.

In exemplary embodiments of the inventive concept, the image generator 1214 may generate merged image data having an increased dynamic range by receiving a plurality of image data of different exposure times from at least one of the plurality of sub image processors 1212a, 1212b, and 1212c, and performing high dynamic range (HDR) processing on the plurality of image data.

The camera module controller 1216 may provide control signals to the camera modules 1100a, 1100b, and 1100c. The control signals generated from the camera module controller 1216 may be respectively provided to the corresponding camera modules 1100a, 1100b, and 1100c through control signal lines CSLa, CSLb, and CSLc separated from one another.

One of the plurality of camera modules 1100a, 1100b, and 1100c may be designated as a master camera (e.g., 1100b) depending on the generating information including a zoom signal or the mode signal, and the remaining camera modules (e.g., 1100a and 1100c) may be designated as a slave camera. The above designation information may be included in the control signals, and the control signals including the designation information may be respectively provided to the corresponding camera modules 1100a, 1100b, and 1100c through the control signal lines CSLa, CSLb, and CSLc separated from one another.

Camera modules operating as a master and a slave may be changed depending on the zoom factor or an operating mode signal. For example, in the case where the field of view of the camera module 1100a is wider than the field of view of the camera module 1100b and the zoom factor indicates a low zoom ratio, the camera module 1100b may operate as a master, and the camera module 1100a may operate as a slave. In contrast, in the case where the zoom factor indicates a high zoom ratio, the camera module 1100a may operate as a master, and the camera module 1100b may operate as a slave.

In exemplary embodiments of the inventive concept, the control signal provided from the camera module controller 1216 to each of the camera modules 1100a, 1100b, and 1100c may include a sync enable signal. For example, in the case where the camera module 1100b is used as a master camera and the camera modules 1100a and 1100c are used as a slave camera, the camera module controller 1216 may transmit the sync enable signal to the camera module 1100b. The camera module 1100b that is provided with the sync enable signal may generate a sync signal based on the provided sync enable signal, and may provide the generated sync signal to the camera modules 1100a and 1100c through a sync signal line SSL. The camera module 1100b and the camera modules 1100a and 1100c may be synchronized with the sync signal to transmit image data to the application processor 1200.

In exemplary embodiments of the inventive concept, the control signal provided from the camera module controller 1216 to each of the camera modules 1100a, 1100b, and 1100c may include mode information according to the mode signal. Based on the mode information, the plurality of camera modules 1100a, 1100b, and 1100c may operate in a first operating mode and a second operating mode with regard to a sensing speed.

In the first operating mode, the plurality of camera modules 1100a, 1100b, and 1100c may generate image signals at a first speed (e.g., may generate image signals at a first frame rate), may encode the image signals at a second speed (e.g., may encode the image signal at a second frame rate higher than the first frame rate), and transmit the encoded image signals to the application processor 1200. In this case, the second speed may be about 30 times or less the first speed.

The application processor 1200 may store the received image signals, e.g., the encoded image signals, in the internal memory 1230 provided therein or the external memory 1400 provided outside the application processor 1200. Afterwards, the application processor 1200 may read and decode the encoded image signals from the internal memory 1230 or the external memory 1400, and may display image data generated based on the decoded image signals. For example, a corresponding one among sub image processors 1212a, 1212b, and 1212c of the image processing device 1210 may perform decoding and may also perform image processing on the decoded image signal.

In the second operating mode, the plurality of camera modules 1100a, 1100b, and 1100c may generate image signals at a third speed (e.g., may generate image signals at a third frame rate lower than the first frame rate), and transmit the image signals to the application processor 1200. The image signals provided to the application processor 1200 may be signals that are not encoded. The application processor 1200 may perform image processing on the received image signals or may store the image signals in the internal memory 1230 or the external memory 1400.

The PMIC 1300 may supply powers, for example, power supply voltages, to the plurality of camera modules 1100a, 1100b, and 1100c. For example, under control of the application processor 1200, the PMIC 1300 may supply a first power to the camera module 1100a through a power signal line PSLa, may supply a second power to the camera module 1100b through a power signal line PSLb, and may supply a third power to the camera module 1100c through a power signal line PSLc.

In response to a power control signal PCON from the application processor 1200, the PMIC 1300 may generate a power corresponding to each of the plurality of camera modules 1100a, 1100b, and 1100c, and may adjust a level of the power. The power control signal PCON may include a power adjustment signal for each operating mode of the plurality of camera modules 1100a, 1100b, and 1100c. For example, the operating modes may include a low-power mode. In this case, the power control signal PCON may include information about a camera module operating in the low-power mode and a set power level. Levels of the powers respectively provided to the plurality of camera modules 1100a, 1100b, and 1100c may be identical to each other or may be different from one another. Additionally, a level of a power may be dynamically changed.

The camera module 1100b may correspond to the electronic device 100 of FIG. 1. The image sensing device 1140 may correspond to the image sensor 110 of FIG. 1. The storage unit 1150 may include the processor 120 of FIG. 1.

In the above exemplary embodiments, the terms "image data", "partial image data", "partial data", and "pieces of partial data" are used. The terms may be interchangeably used without departing from the spirit and scope of the inventive concept. In an exemplary embodiment of the inventive concept, image data may indicate data corresponding to one frame, and the meaning of the image data described above is not limited. The terms "partial image data", "partial data", and "pieces of partial data" may indicate a portion of data of one frame, but meanings of "partial image data", "partial data", and "pieces of partial data" are not limited.

In the above description, components according to exemplary embodiments of the inventive concept are described by using the terms "first", "second", "third", and the like. However, the terms "first", "second", "third", and the like may be used to distinguish components from one another and do not limit the inventive concept. For example, the terms "first", "second", "third", and the like do not indicate an order or a numerical meaning of any form.

In the above description, components according to exemplary embodiments of the inventive concept are described by using blocks. The blocks may be implemented with various hardware devices, such as an integrated circuit (IC), an application-specific IC (ASCI), a field programmable gate array (FPGA), or a complex programmable logic device (CPLD), firmware driven in hardware devices, software such as an application, or a combination of a hardware device and software. Additionally, the blocks may include circuits implemented with semiconductor elements in an integrated circuit or circuits enrolled/protected as intellectual property (IP).

According to exemplary embodiments of the inventive concept, high-power and high-quality conversion and low-power and low-quality conversion are selectively performed depending on a resolution or an image quality of portions of image data obtained by an image sensor. Accordingly, an electronic device capable of generating image data having an improved resolution or image quality and reducing power consumption, as well as an operating method of the electronic device, are provided.

While the inventive concept has been described with reference to exemplary embodiments thereof, it will be apparent to those of ordinary skill in the art that various changes and modifications in form and details may be made thereto without departing from the spirit and scope of the inventive concept as set forth in the following claims.

What is claimed is:

1. An electronic device comprising:
   an image sensor configured to capture a target to generate first image data; and
   a processor, wherein the processor is configured to:
   perform directional interpolation on a first area of the first image data to generate first partial image data;
   perform upscale on a second area of the first image data to generate second partial image data;
   perform the directional interpolation on a third area of the first image data;
   perform the upscale on the third area of the first image data; and
   combine the first partial image data and the second partial image data to generate second image data,
   wherein the first area and the second area are different, and
   wherein the directional interpolation generates image data having a resolution higher than that of image data generated by the upscale.

2. The electronic device of claim 1, wherein the first image data is based on a non-Bayer pattern, and
   wherein the second image data is based on a Bayer pattern.

3. The electronic device of claim 1, wherein the processor is further configured to:
   perform alpha blending on a result of the directional interpolation on the third area of the first image data and a result of the upscale on the third area of the first image data to generate third partial image data.

4. The electronic device of claim 3, wherein the processor is further configured to:
   combine the first partial image data, the second partial image data, and the third partial image data to generate the second image data.

5. The electronic device of claim 3, wherein the third area is divided into two or more sub-areas, and
   wherein the processor differently adjusts alpha values to be applied to results of the directional interpolation and results of the upscale in the two or more sub-areas.

6. The electronic device of claim 5, wherein the first area includes a circular area placed at a center of the first image data, and
   wherein the two or more sub-areas include two or more concentric circles surrounding the first area.

7. The electronic device of claim 1, wherein the first area includes a circular area placed at a center of the first image data, and
   wherein the second area includes a remaining area of the first image data, which surrounds the first area.

8. The electronic device of claim 1, wherein the processor determines the first area and the second area using location information obtained in a process of calibrating the image sensor.

9. The electronic device of claim 8, wherein the location information indicates the first area and the second area based on a distance from a center of the first image data.

10. The electronic device of claim 9, wherein the location information is based on a change of a modulation transfer function (MTF) according to a distance from the center of the first image data.

11. An operating method of an electronic device which includes an image sensor and a processor, the operating method comprising:
    capturing, at the image sensor, a target to generate first image data;
    performing, at the processor, directional interpolation on a first area of the first image data to generate first partial image data;
    performing, at the processor, upscale on a second area of the first image data to generate second partial image data;
    performing, at the processor, the directional interpolation on a third area of the first image data to generate third partial image data;
    performing, at the processor, the upscale on the third area of the first image data to generate fourth partial image data; and
    combining, at the processor, the first partial image data and the second partial image data to generate second image data.

12. The operating method of claim 11, further comprising:
    performing, at the processor, alpha blending on the third partial image data and the fourth partial image data to generate fifth partial image data.

13. The operating method of claim 12, wherein the combining of the first partial image data and the second partial image data to generate the second image data includes:
    combining, at the processor, the first partial image data, the second partial image data, and the fifth partial image data to generate the second image data.

14. The operating method of claim 12, wherein the performing of the alpha blending to generate the fifth partial image data includes:

selecting the fourth partial image data as background image data;
selecting the third partial image data as foreground image data; and
adjusting an alpha value of the third partial image data.

15. The operating method of claim 12, further comprising:
performing, at the processor, the directional interpolation on a fourth area of the first image data to generate sixth partial image data;
performing, at the processor, the upscale on the fourth area of the first image data to generate seventh partial image data; and
performing, at the processor, alpha blending on the sixth partial image data and the seventh partial image data to generate eighth partial image data,
wherein an alpha value applied to the fifth partial image data and an alpha value applied to the eighth partial image data are different.

16. The operating method of claim 12, wherein the first image data is converted into the second image data using the first partial image data, the second partial image data, and the fifth partial image data, in units of frames.

17. An electronic device comprising:
an image sensor; and
a processor configured to receive first image data from the image sensor and to convert and output the first image data as second image data,
wherein the image sensor includes:
a lens;
a color filter array including color filters configured to pass specific frequency components of a light incident through the lens;
a pixel array including pixels configured to convert intensities of the specific frequency components of the light passing through the color filters into analog signals; and
an analog-to-digital converter configured to convert the analog signals into digital signals and to output the digital signals to the image sensor,
wherein the processor includes:
a first memory configured to receive the first image data;
location information storage configured to store location information, wherein the location information includes a first area having a resolution level higher than a first threshold level and a second area having a resolution level lower than or equal to a second threshold level;
a first conversion circuit configured to perform a first conversion on first input data and to output a result of the first conversion as first partial image data;
a second conversion circuit configured to perform a second conversion on second input data and to output a result of the second conversion as second partial image data;
a selection circuit configured to output the first image data in a form of the first input data, the second input data, or the first input data and the second input data, based on the location information; and
a mixer configured to combine the first partial image data and the second partial image data to generate the second image data, in response to a selection signal from the selection circuit, and
wherein, when the first partial image data and the second partial image data are output together, the mixer is configured to perform alpha blending on the first partial image data and the second partial image data.

18. The electronic device of claim 17, wherein the first conversion is directional interpolation, and
wherein the second conversion is upscale.

* * * * *